(12) United States Patent
Shiino et al.

(10) Patent No.: US 9,672,926 B2
(45) Date of Patent: Jun. 6, 2017

(54) APPARATUS AND METHOD OF PROGRAMMING AND VERIFICATION FOR A NONVOLATILE SEMICONDUCTOR MEMORY DEVICE

(71) Applicant: KABUSHIKI KAISHA TOSHIBA, Minato-ku, Tokyo (JP)

(72) Inventors: Yasuhiro Shiino, Fujisawa (JP); Nobushi Matsuura, Kawasaki (JP); Masashi Yoshida, Yokohama (JP); Eietsu Takahashi, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 73 days.

(21) Appl. No.: 14/014,125

(22) Filed: Aug. 29, 2013

(65) Prior Publication Data

US 2014/0340964 A1  Nov. 20, 2014

(30) Foreign Application Priority Data

May 16, 2013  (JP) ................. 2013-104179

(51) Int. Cl.
*G11C 16/26* (2006.01)
*G11C 16/34* (2006.01)
(Continued)

(52) U.S. Cl.
CPC .......... *G11C 16/26* (2013.01); *G11C 11/5628* (2013.01); *G11C 11/5642* (2013.01);
(Continued)

(58) Field of Classification Search
CPC ..................................... G11C 16/26
(Continued)

(56) References Cited

U.S. PATENT DOCUMENTS 5,570,315 A * 10/1996 Tanaka ................ G11C 11/5621
365/185.03
7,145,806 B2 * 12/2006 Kawai ...................... 365/185.25
(Continued)

FOREIGN PATENT DOCUMENTS

JP    2007519162 A    7/2007
JP    2010134984 A    6/2010
(Continued)

OTHER PUBLICATIONS

Japanese Office Action (and English translation thereof) dated Jul. 19, 2016, issued in counterpart Japanese Application No. 2013-104179.

*Primary Examiner* — Anthan Tran
*Assistant Examiner* — Mushfique Siddique
(74) *Attorney, Agent, or Firm* — Holtz, Holtz & Volek PC

(57) ABSTRACT

According to one embodiment, a nonvolatile semiconductor memory device includes a memory cell array and a control circuit configured to repeat a program operation and a verify operation. The control circuit performs a first verify operation of sensing whether threshold voltages of selected memory cells are greater than or equal to a first threshold voltage, and a second verify operation of sensing whether the threshold voltages of the selected memory cells are greater than or equal to a second threshold voltage (first threshold voltage<second threshold voltage), and the control circuit changes a charge voltage for the bit lines between the first verify operation and the second verify operation.

19 Claims, 30 Drawing Sheets

(51) Int. Cl.
  *G11C 11/56*    (2006.01)
  *G11C 16/04*    (2006.01)
(52) U.S. Cl.
  CPC ...... *G11C 16/3459* (2013.01); *G11C 16/0483* (2013.01); *G11C 2211/5621* (2013.01)
(58) Field of Classification Search
  USPC .................................................. 365/185.03
  See application file for complete search history.

(56) References Cited

U.S. PATENT DOCUMENTS

| | | | |
|---|---|---|---|
| 2003/0147278 A1* | 8/2003 | Tanaka | G11C 11/5628 365/185.03 |
| 2004/0136236 A1* | 7/2004 | Cohen | G11C 11/5642 365/185.2 |
| 2004/0170056 A1* | 9/2004 | Shibata | G11C 11/5628 365/185.03 |
| 2005/0162913 A1 | 7/2005 | Chen | |
| 2007/0279982 A1* | 12/2007 | Shibata | G11C 11/5642 365/185.03 |
| 2009/0323432 A1 | 12/2009 | Futatsuyama et al. | |
| 2010/0135078 A1 | 6/2010 | Iwai et al. | |
| 2010/0232230 A1* | 9/2010 | Ueno | G11C 16/3436 365/185.22 |
| 2011/0305089 A1 | 12/2011 | Abe et al. | |
| 2012/0072648 A1* | 3/2012 | Shiino et al. | 711/103 |
| 2012/0092931 A1* | 4/2012 | Edahiro | G11C 16/3459 365/185.17 |
| 2012/0198297 A1* | 8/2012 | Kamigaichi | G11C 11/5628 714/746 |
| 2012/0314499 A1* | 12/2012 | Yuan | G11C 16/26 365/185.11 |
| 2015/0262679 A1* | 9/2015 | Shimura | G11C 16/10 365/185.22 |

FOREIGN PATENT DOCUMENTS

| | | |
|---|---|---|
| JP | 2011-210337 A | 10/2011 |
| JP | 2012-048813 A | 3/2012 |

* cited by examiner

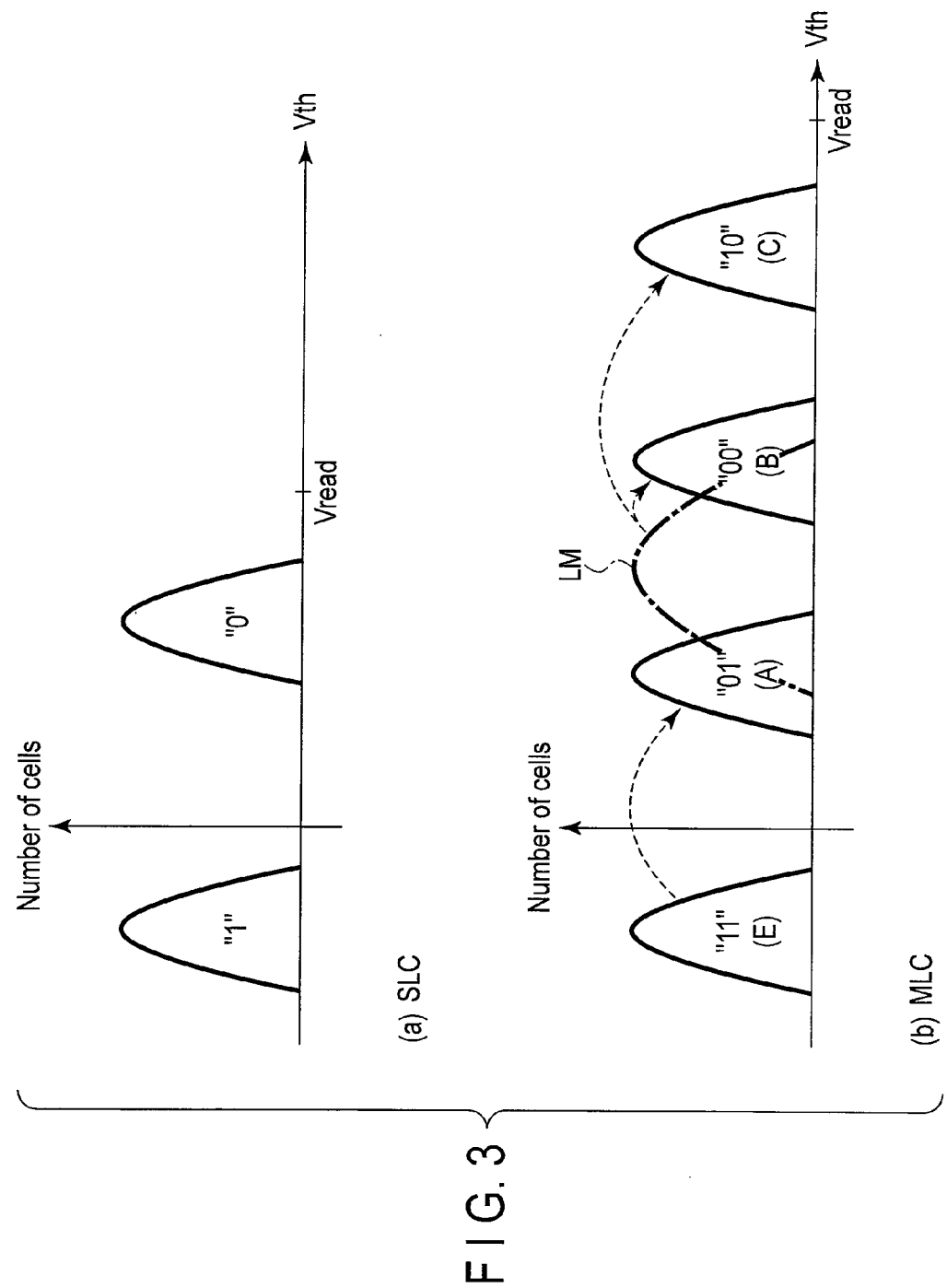
F I G. 3

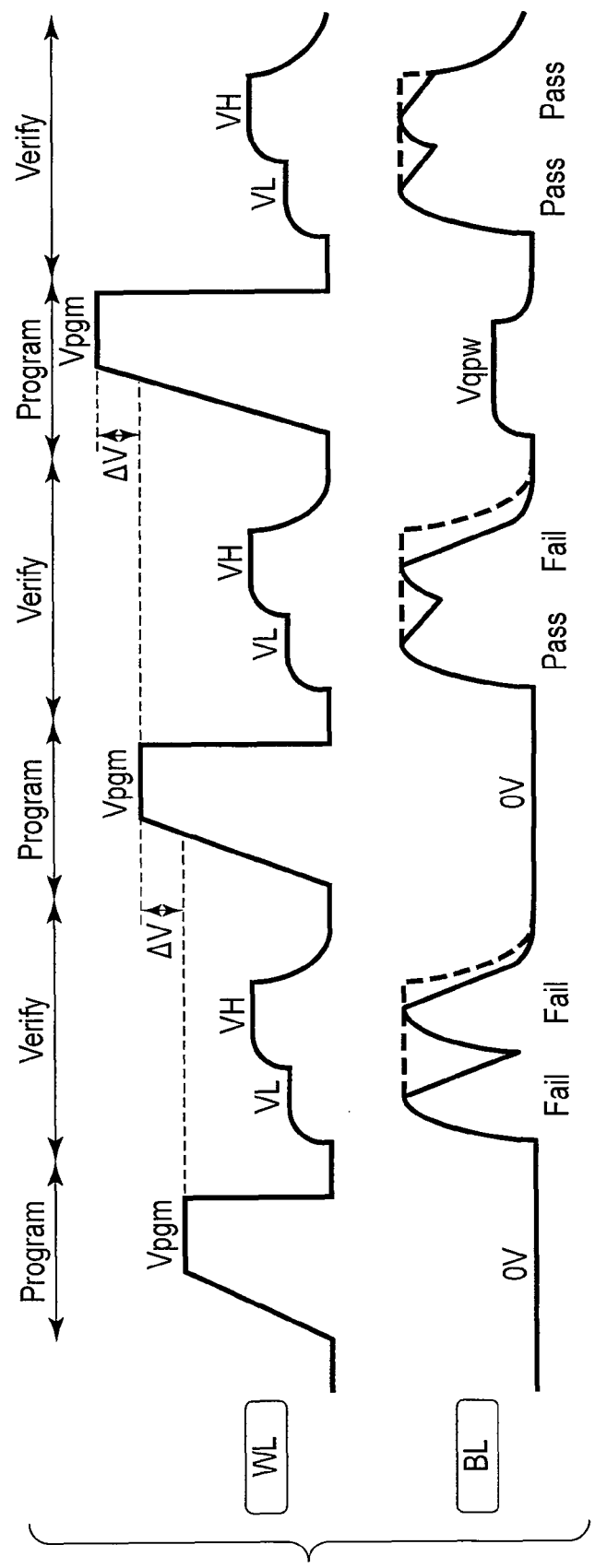
F I G. 5

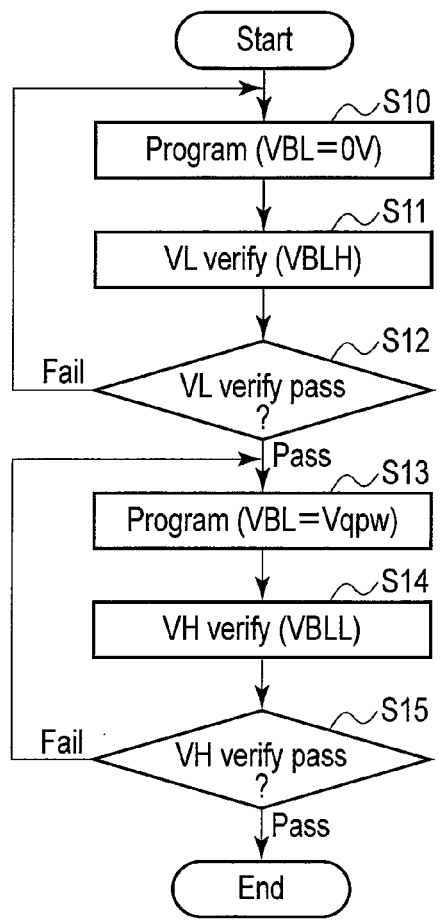
F I G. 7
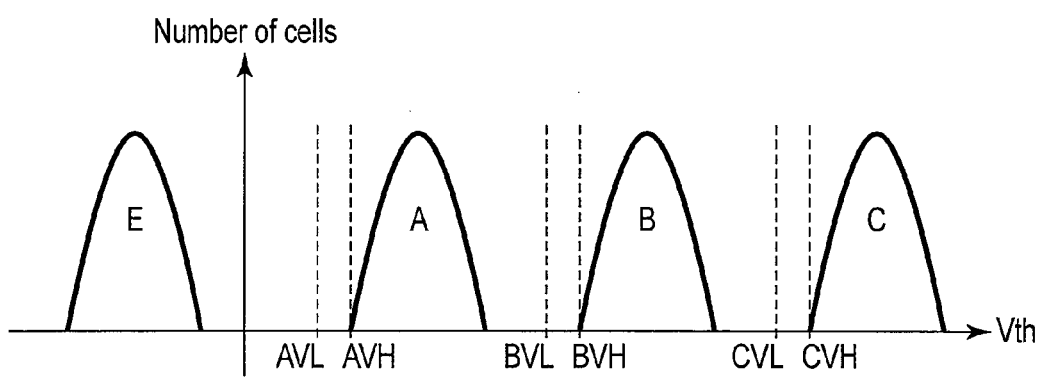
F I G. 8

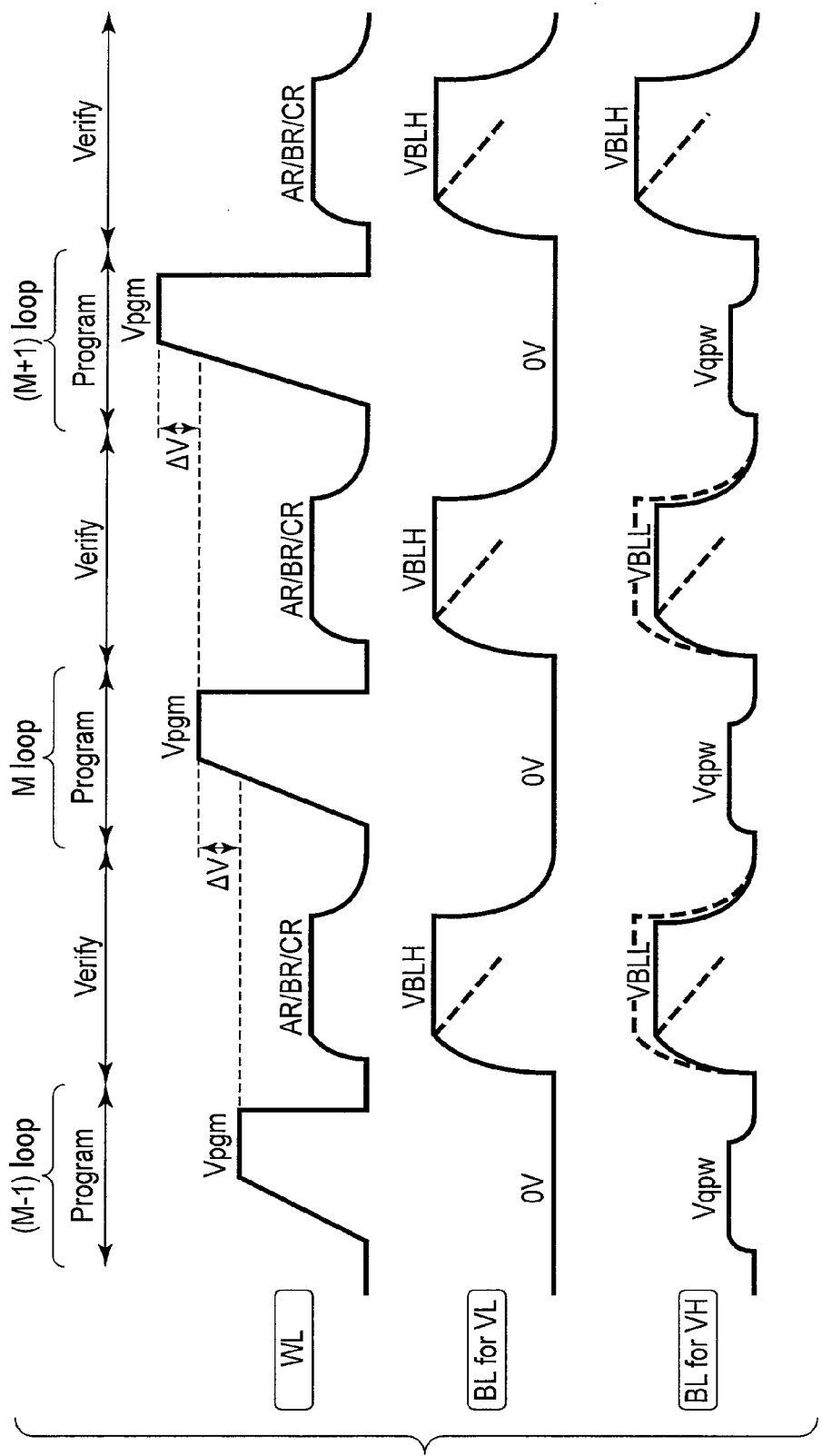
F I G. 13

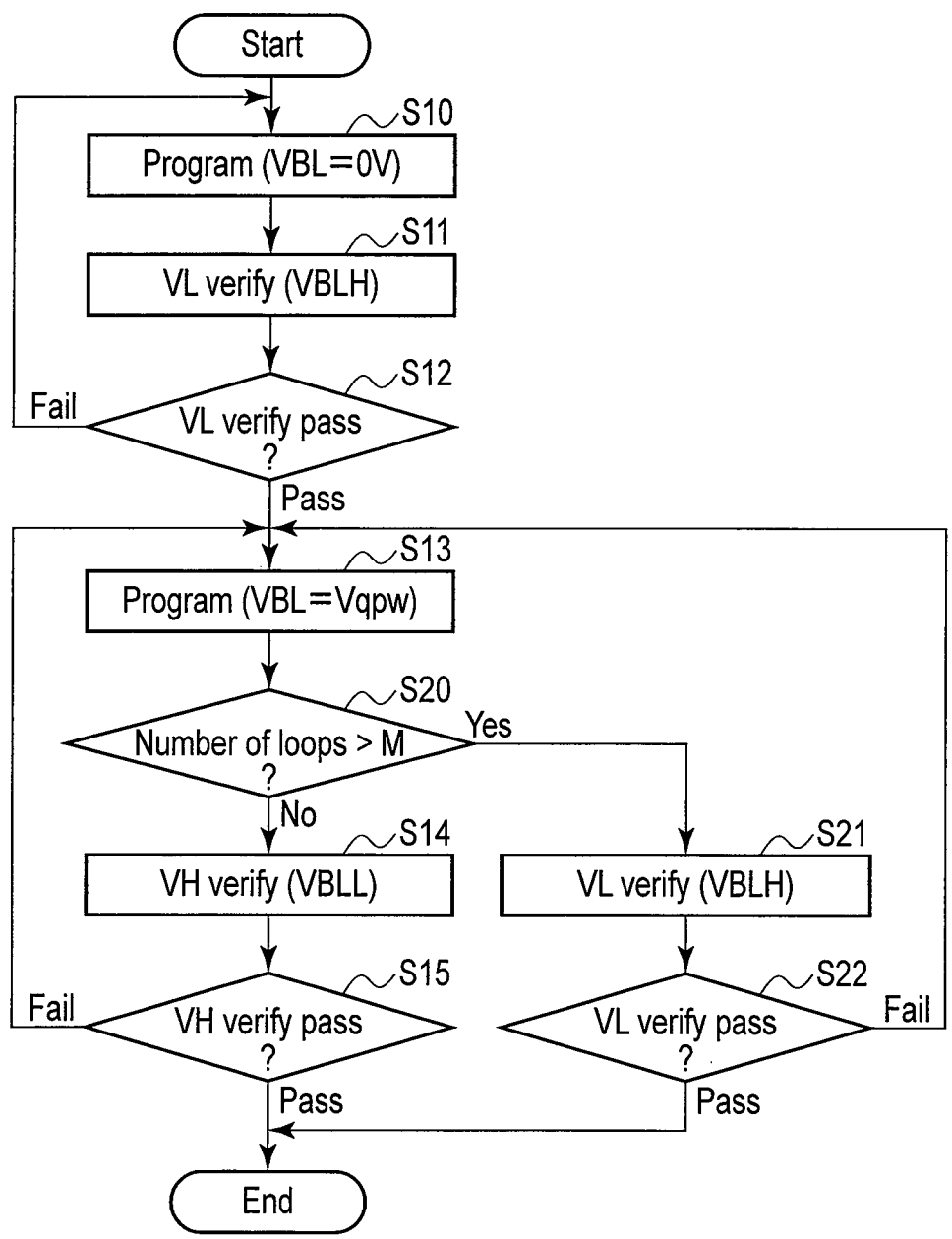
F I G. 14

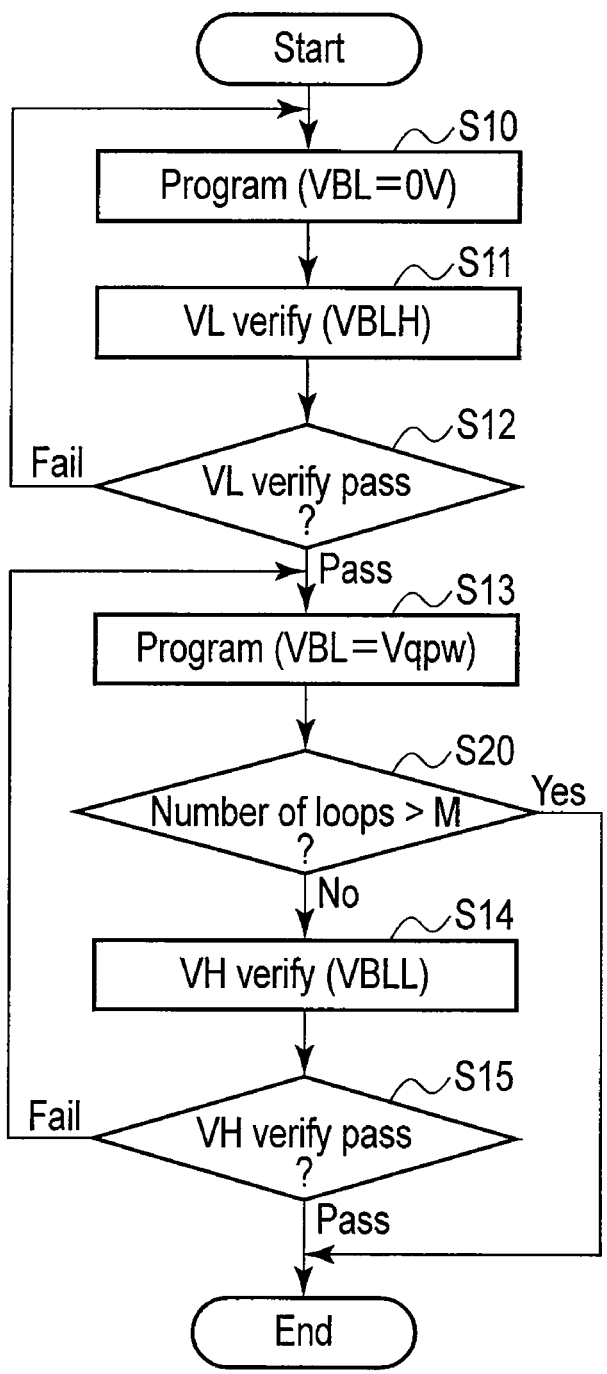
F I G. 16

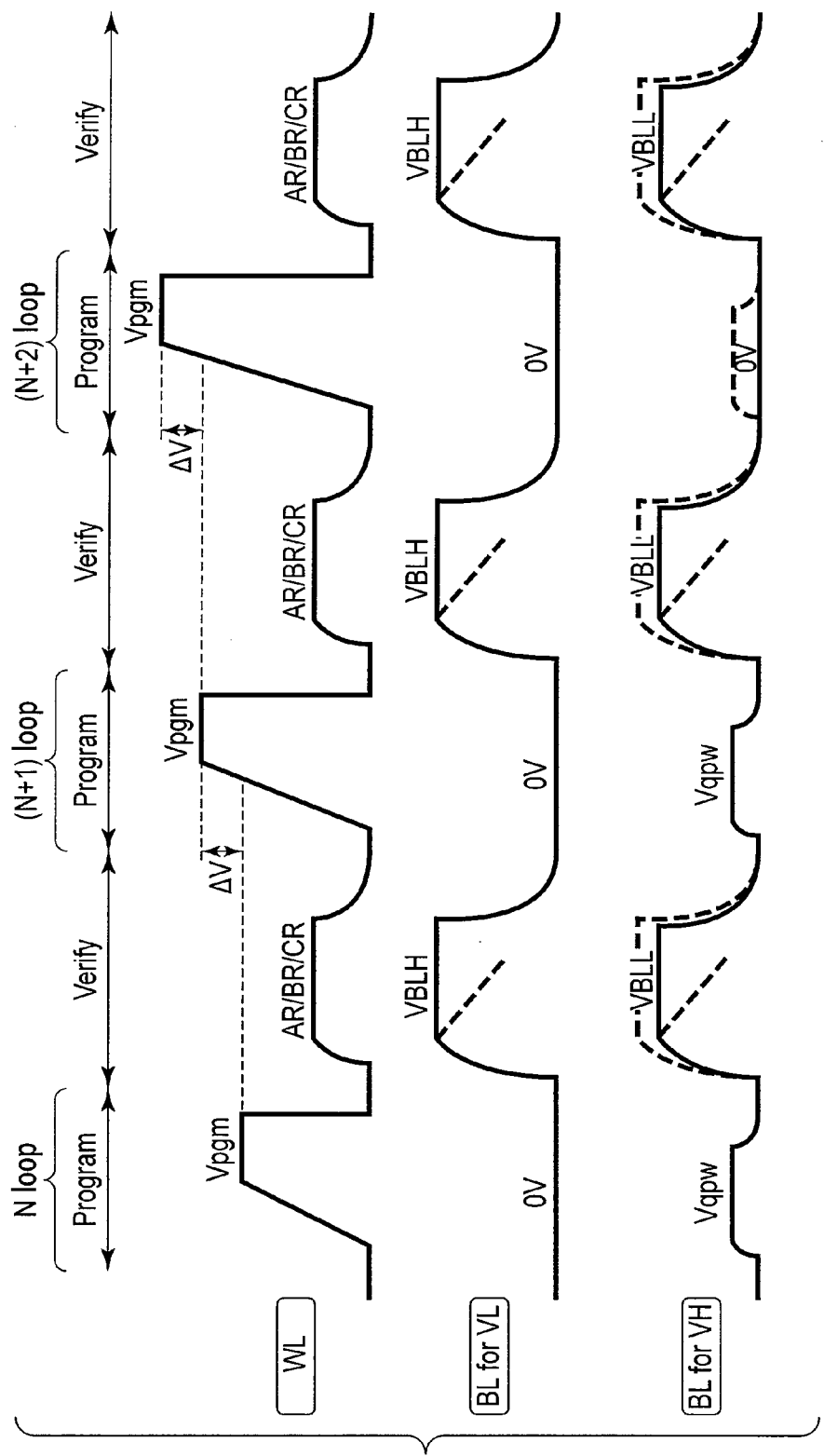
F I G. 17

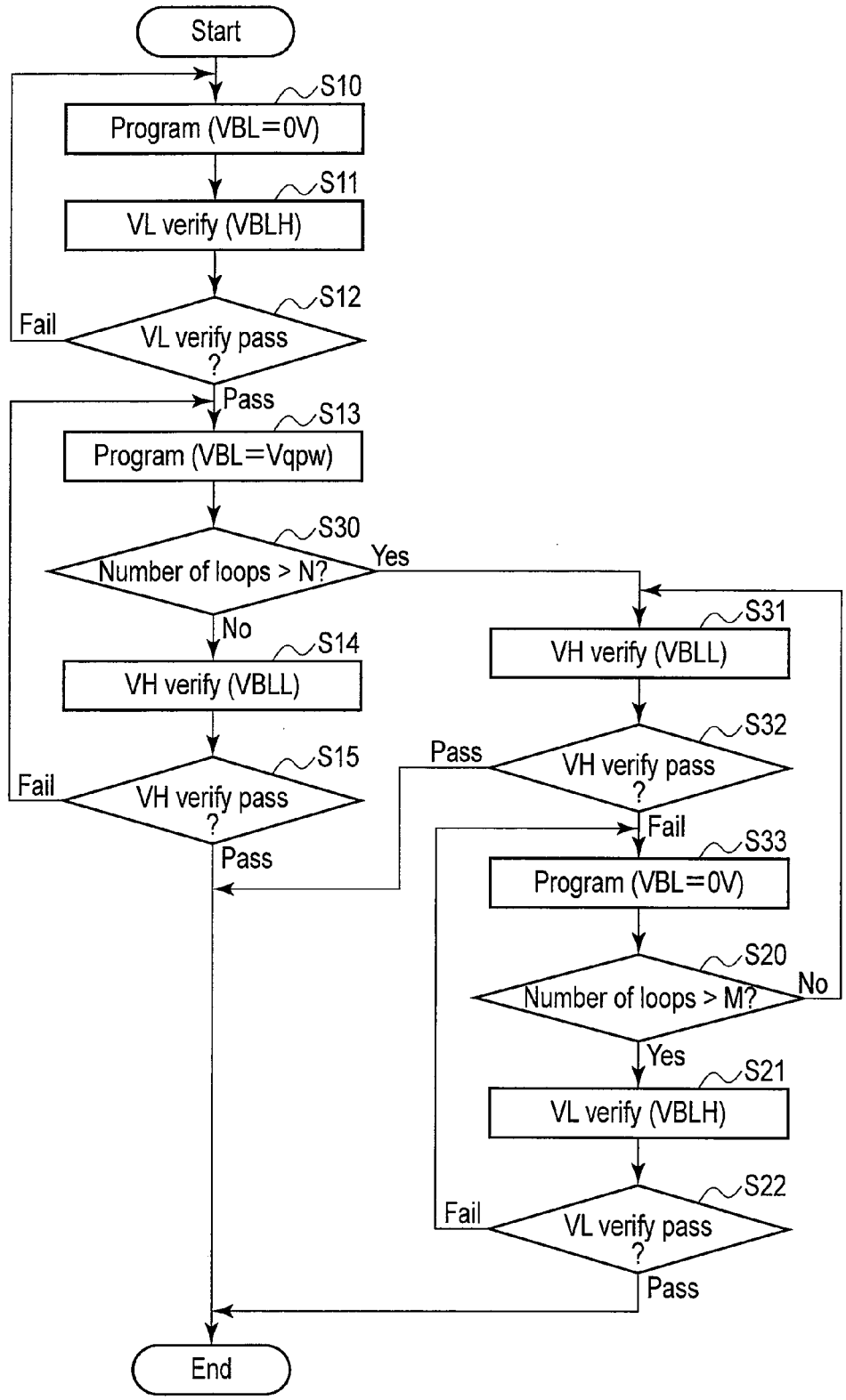
F I G. 20

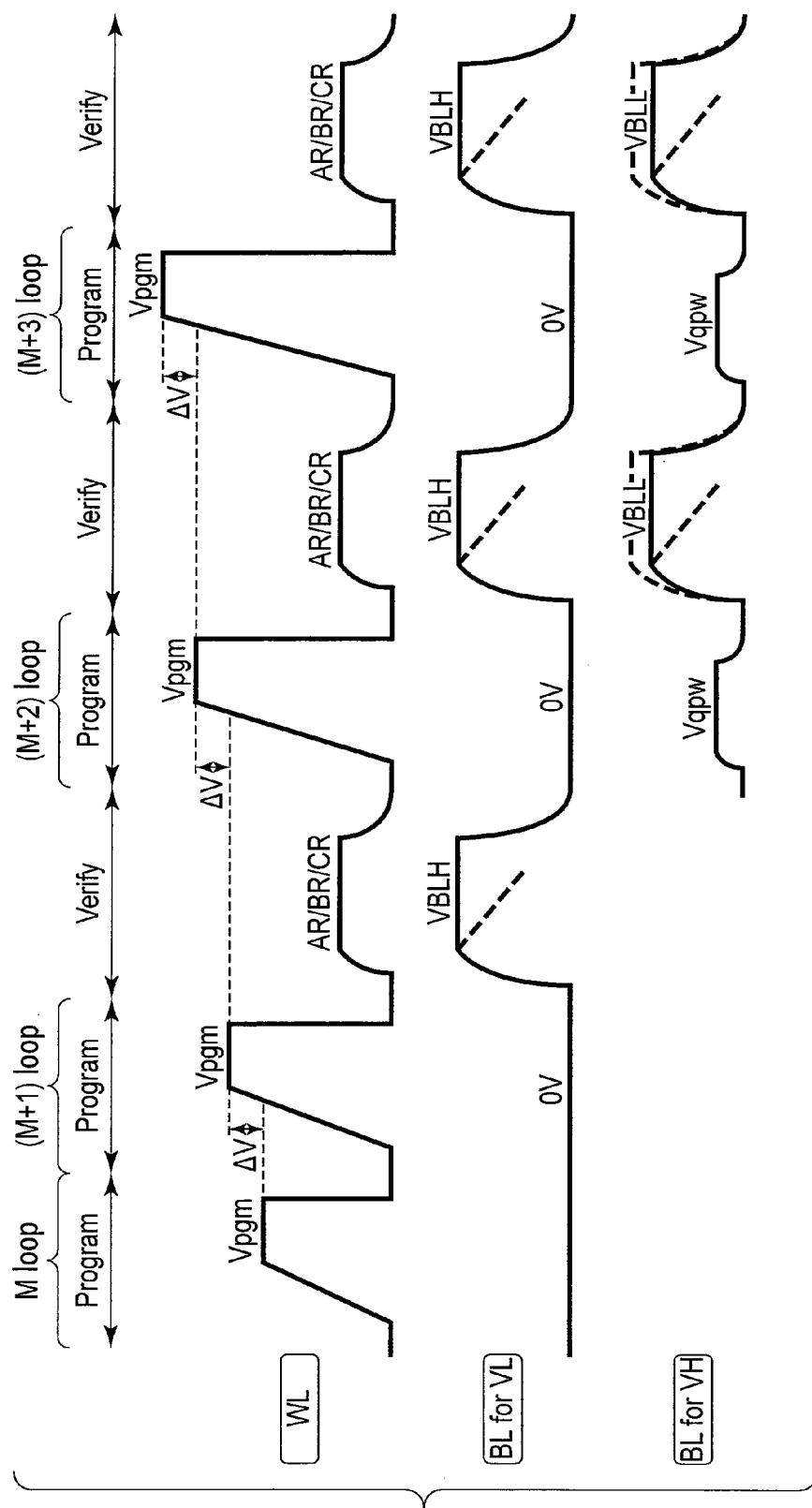
F I G. 21

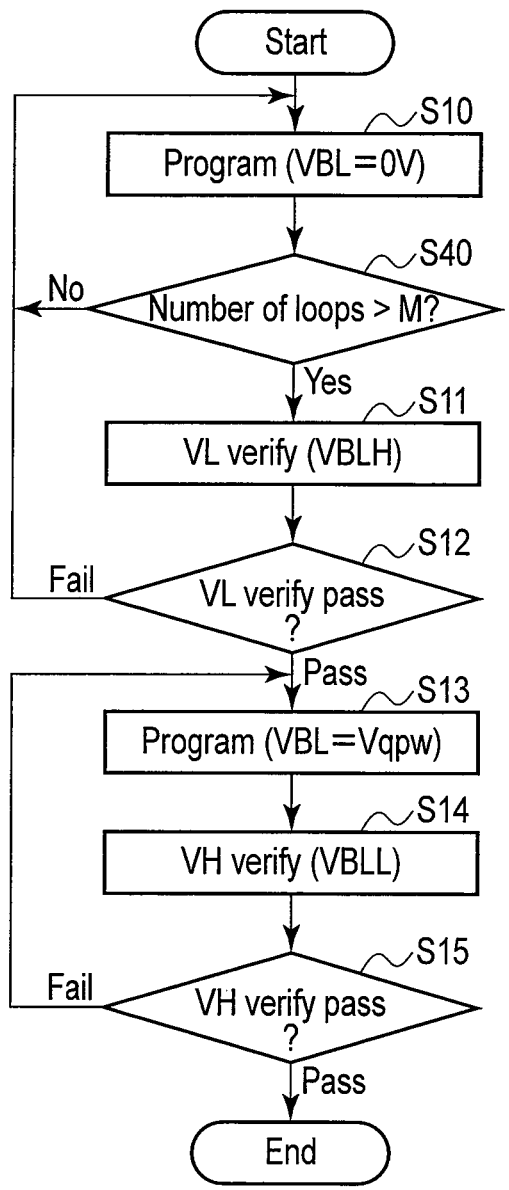
F I G. 22

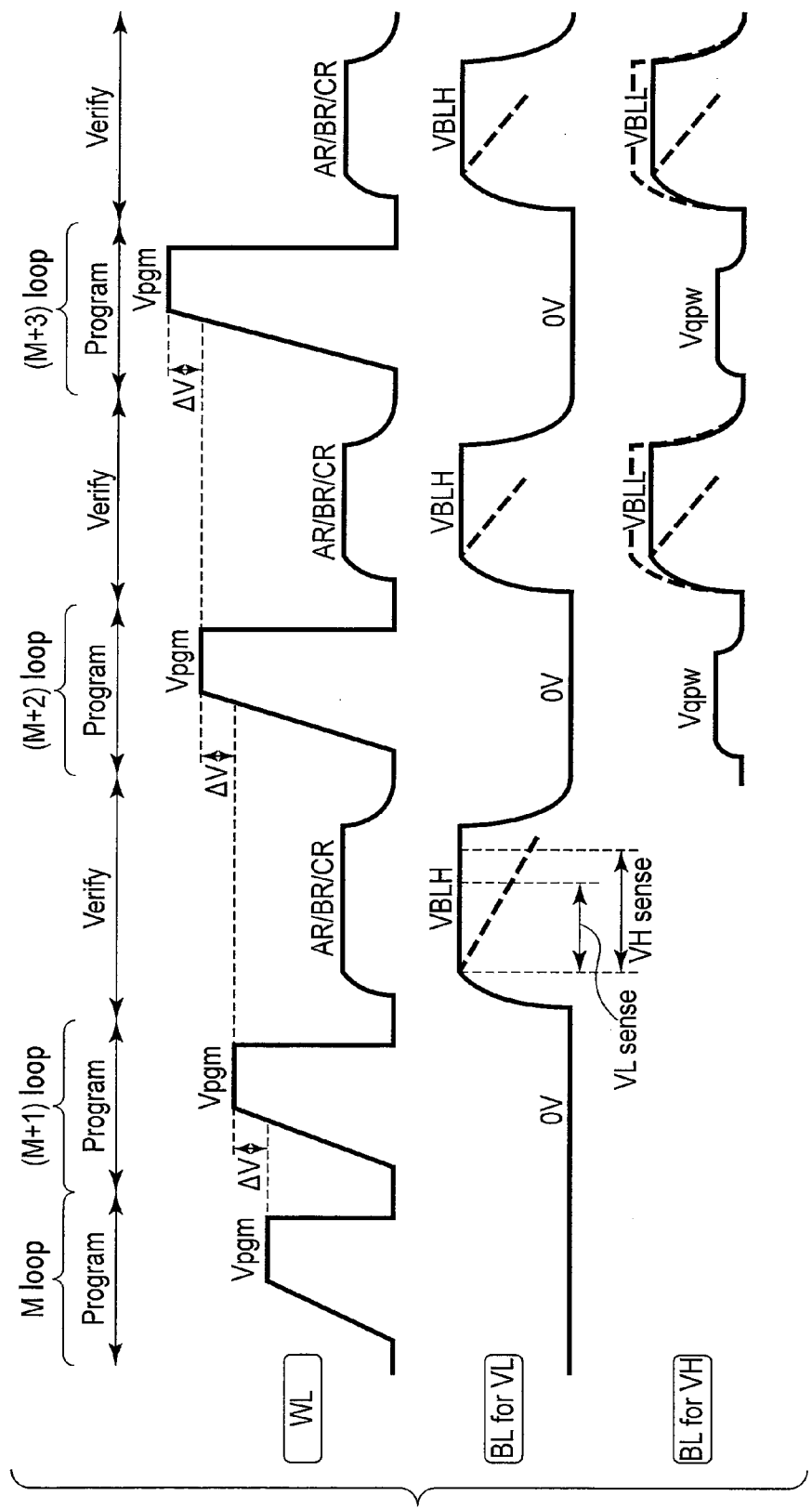
F I G. 23

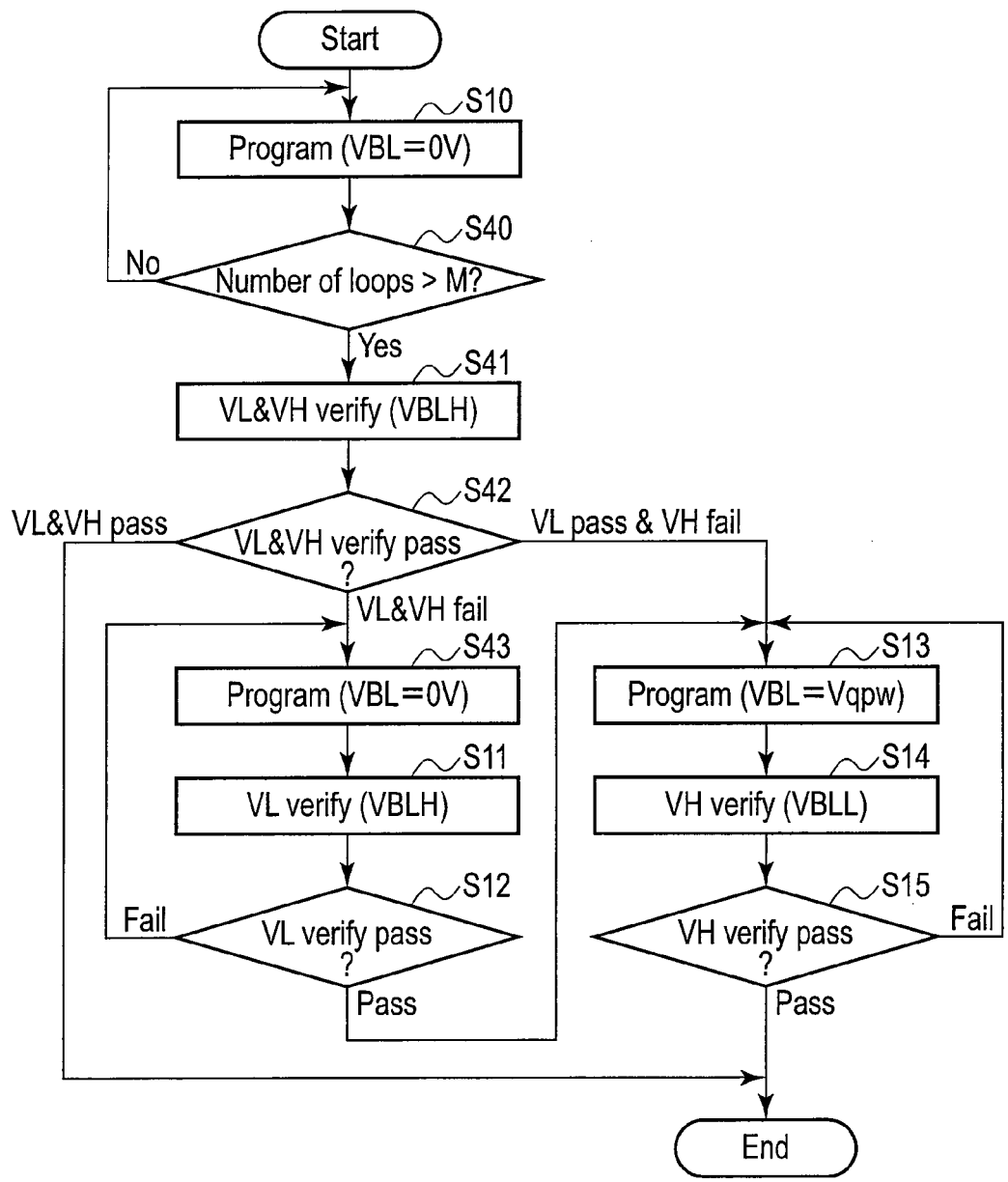
F I G. 24

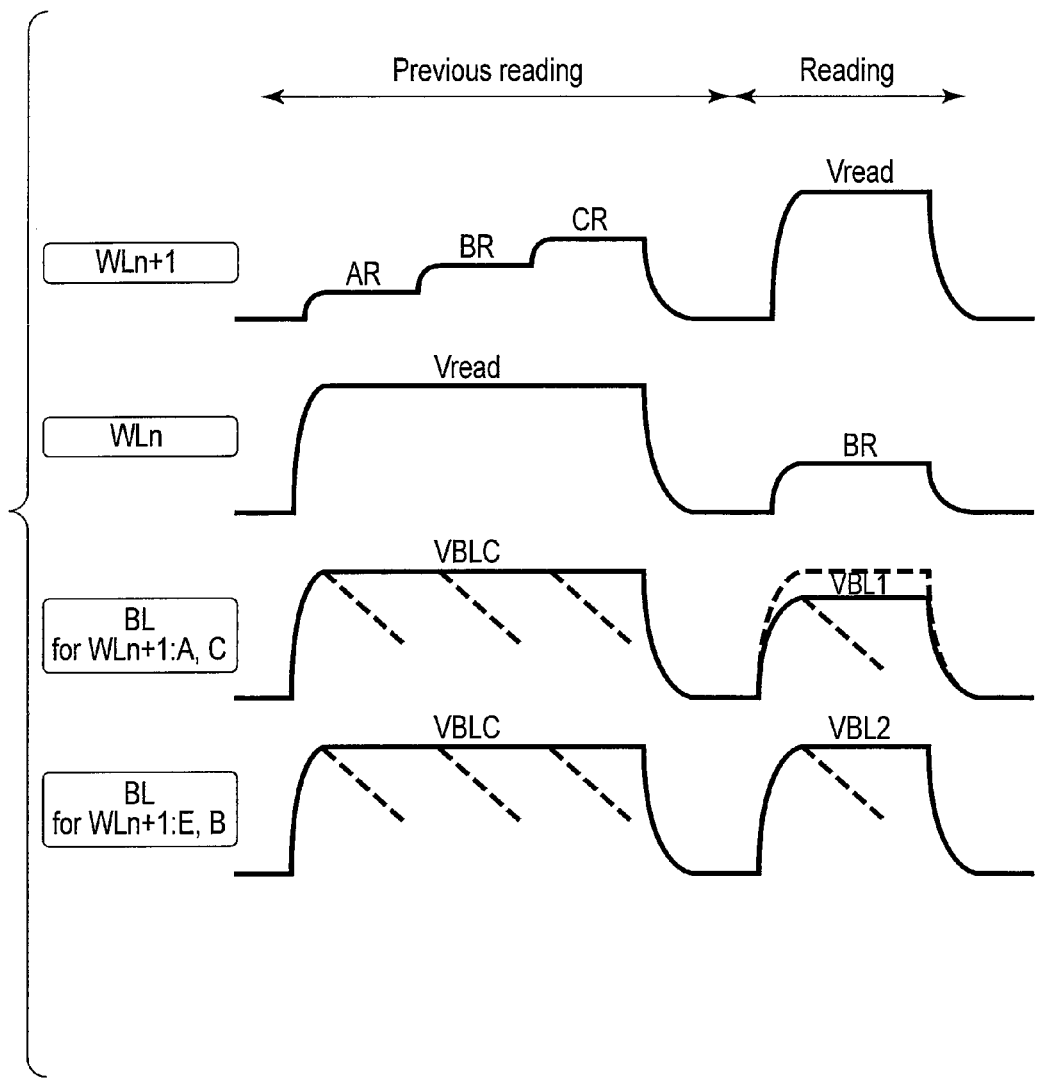
F I G. 30

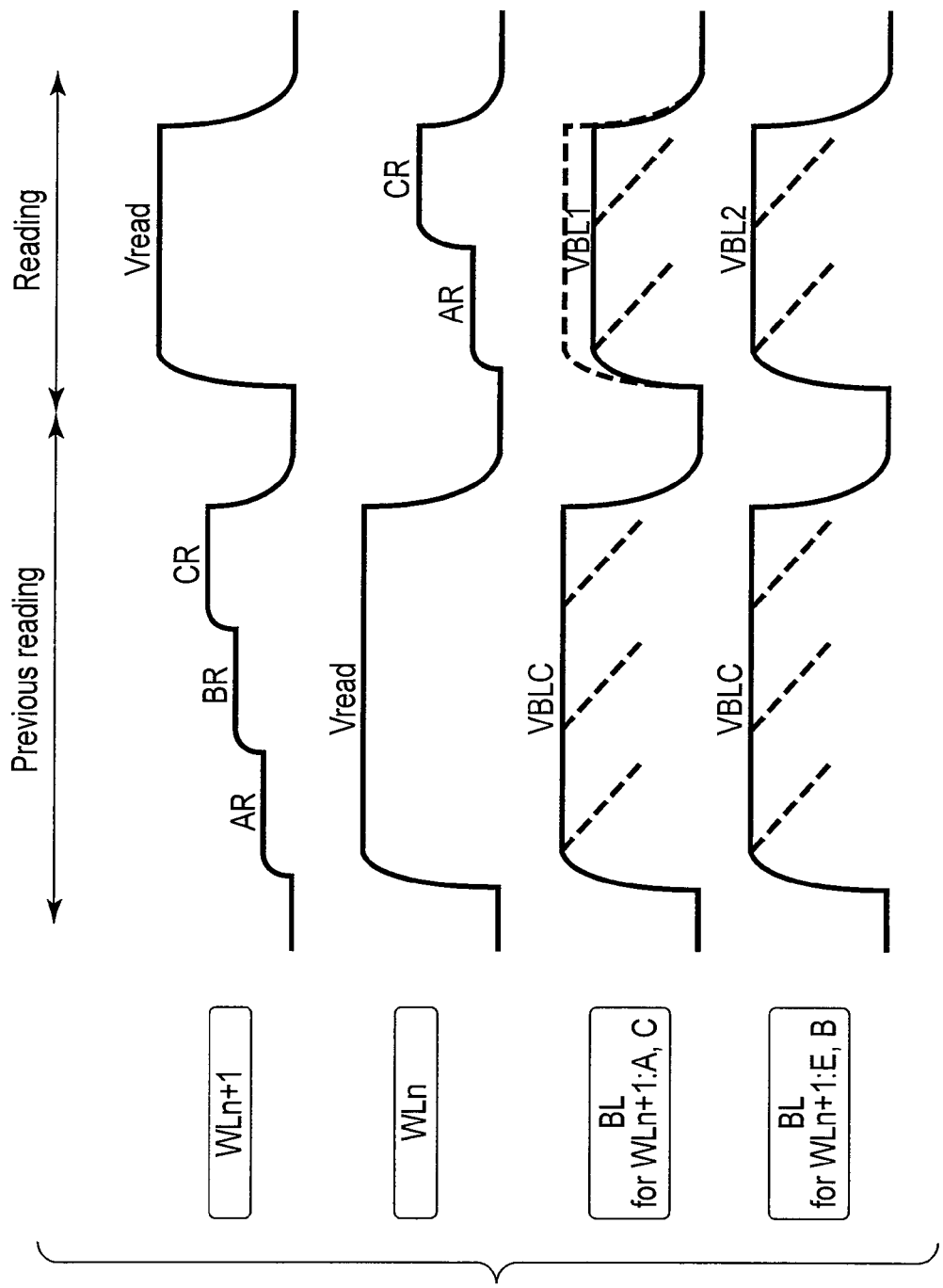
F I G. 31

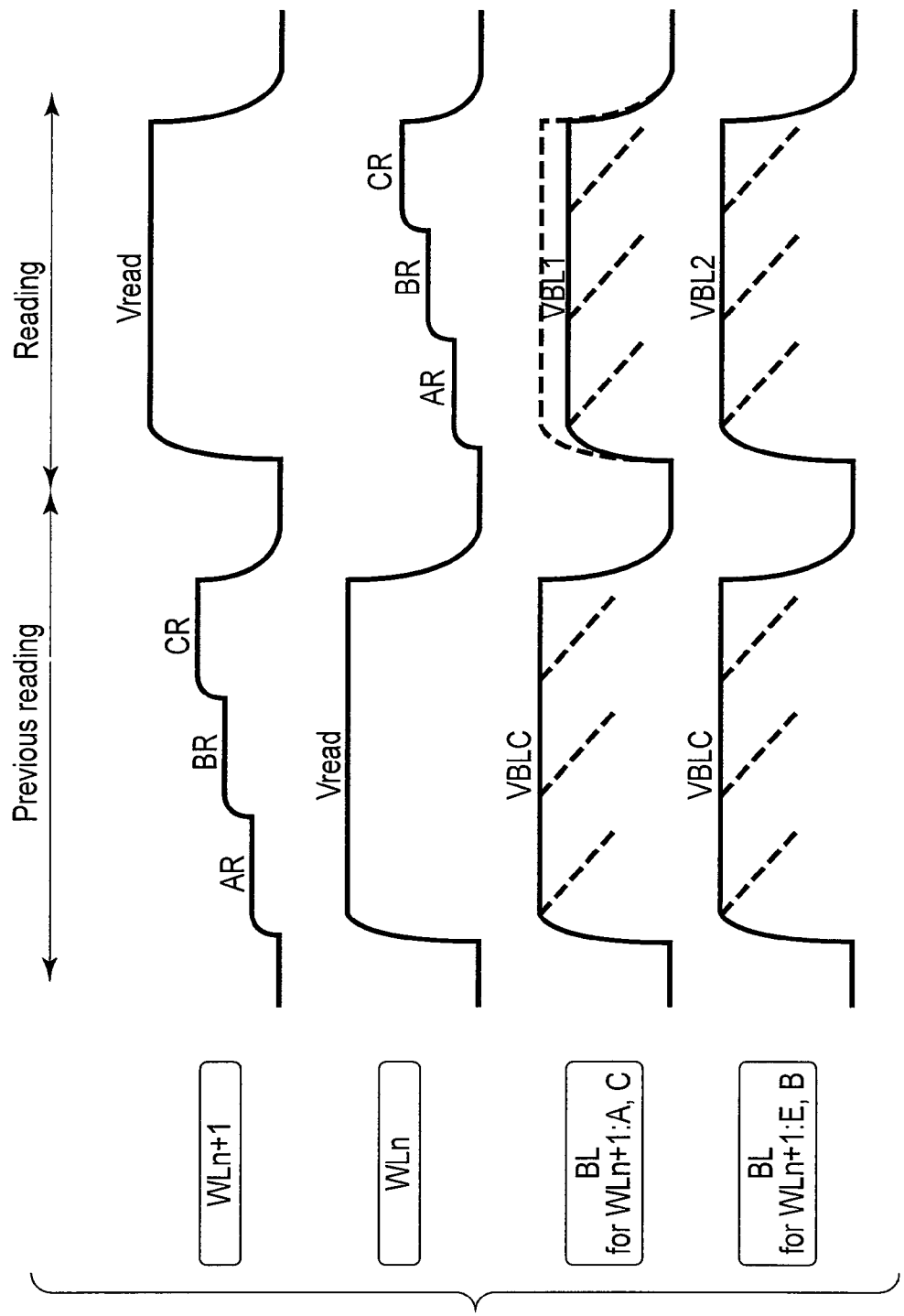
F I G. 32

APPARATUS AND METHOD OF PROGRAMMING AND VERIFICATION FOR A NONVOLATILE SEMICONDUCTOR MEMORY DEVICE

CROSS-REFERENCE TO RELATED APPLICATIONS

This application is based upon and claims the benefit of priority from Japanese Patent Application No. 2013-104179, filed May 16, 2013, the entire contents of which are incorporated herein by reference.

FIELD

Embodiments described herein relate generally to a nonvolatile semiconductor memory device.

BACKGROUND

Many EEPROMs which are known at present use memory cells which store electric charges in a charge storage layer (such as a floating gate electrode). In NAND flash memories, which are an example of such EEPROMs, data rewrite using an FN tunnel current for both write and erase operations is performed. In recent years, multilevel storage technique of storing data of two or more bits in a memory cell has been introduced, and it has become possible to increase the storage capacity twice or more with the physically same cell size.

To improve the reliability of data reading, writing should be performed to set the threshold voltage distribution as narrow as possible. This case requires, however, a fine verify operation, and increases the write time. Although a margin between threshold voltage distributions may be increased by increasing a threshold voltage of each data, it is necessary to increase a write pass voltage and a read pass voltage of non-selected memory cells, since the highest threshold voltage distribution is raised to the high voltage side in this case. This structure increases stress on memory cells.

BRIEF DESCRIPTION OF THE DRAWINGS

FIG. 3 is a diagram illustrating threshold voltage distributions of a memory cell;

FIG. 5 is a timing chart for explaining a program sequence according to a comparative example;

FIG. 7 is a flowchart illustrating the program sequence of the SLC according to the first embodiment;

FIG. 8 is a diagram illustrating verify voltages of threshold voltage distributions;

FIG. 13 is a timing chart illustrating a program sequence according to a third embodiment;

FIG. 14 is a flowchart illustrating the program sequence according to the third embodiment;

FIG. 16 is a flowchart illustrating the program sequence according to the modification;

FIG. 17 is a timing chart illustrating a program sequence according to a fourth embodiment;

FIG. 20 is a flowchart illustrating the program sequence according to the modification;

FIG. 21 is a timing chart illustrating a program sequence according to a fifth embodiment;

FIG. 22 is a flowchart illustrating the program sequence according to the fifth embodiment;

FIG. 23 is a timing chart illustrating a program sequence according to a sixth embodiment;

FIG. 24 is a flowchart illustrating the program sequence according to the sixth embodiment;

FIG. 30 is a timing chart illustrating a lower-page read operation according to a ninth embodiment;

FIG. 31 is a timing chart illustrating an upper-page read operation according to the ninth embodiment; and FIG. 32 is a timing chart illustrating a sequential read operation according to the ninth embodiment.

DETAILED DESCRIPTION

Figure 1:
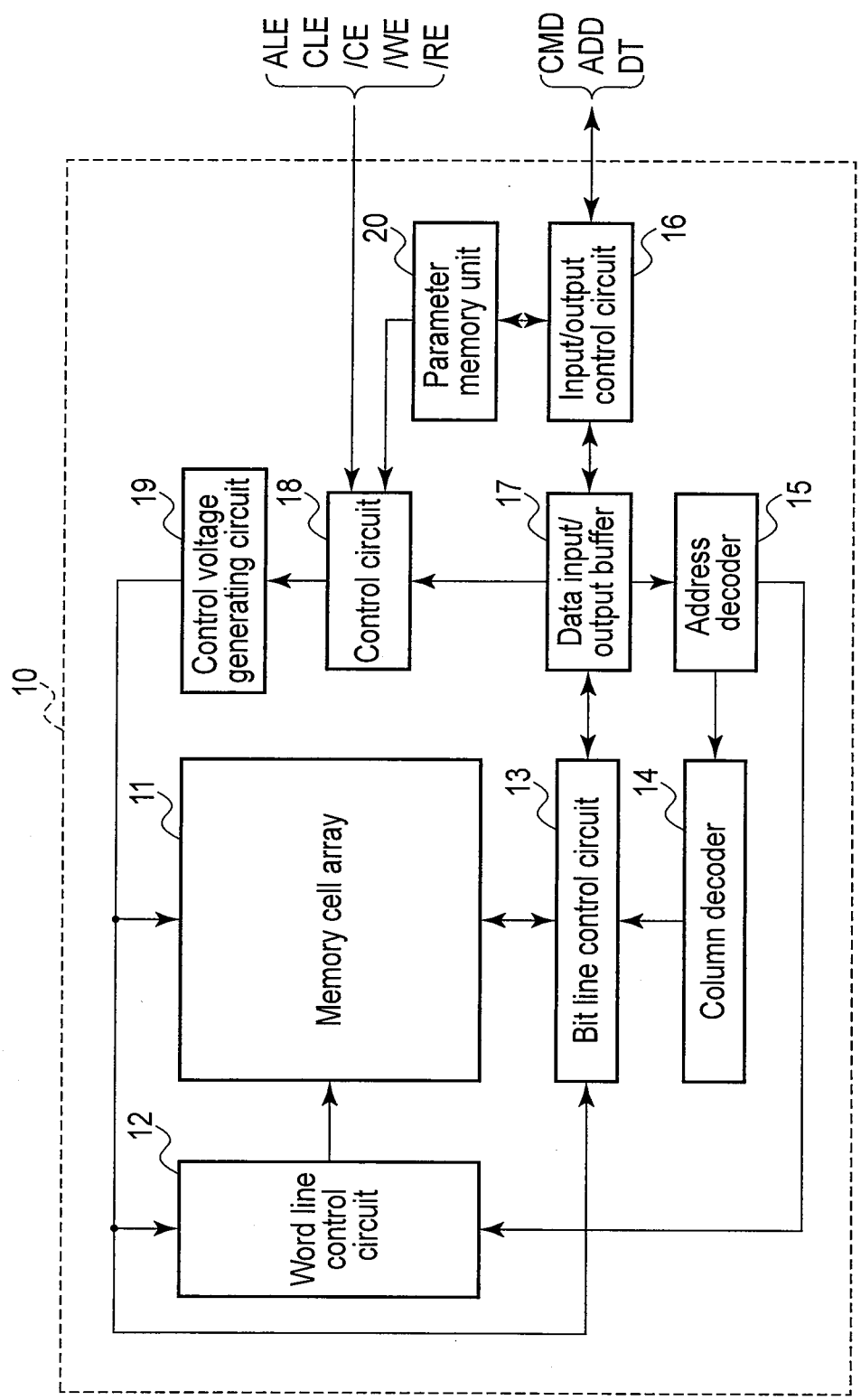
FIG. 1 is a block diagram of a NAND flash memory according to a first embodiment.

In general, according to one embodiment, there is provided a nonvolatile semiconductor memory device comprising:

a memory cell array comprising memory strings, each of the memory strings comprising memory cells connected in series;

bit lines connected to the memory strings, respectively;

word lines connected to the memory cells, respectively, and connected to the memory strings in common; and a control circuit configured to repeat a program operation of applying a program pulse voltage to a selected word line and programming data in selected memory cells connected to the selected word line, and a verify operation of checking threshold voltages of the selected memory cells, wherein the control circuit performs a first verify operation of sensing whether the threshold voltages of the selected memory cells are greater than or equal to a first threshold voltage, and a second verify operation of sensing whether the threshold voltages of the selected memory cells are greater than or equal to a second threshold voltage (first threshold voltage<second threshold voltage), and the control circuit changes a charge voltage for the bit lines between the first verify operation and the second verify operation.

Embodiments will be explained below with reference to the accompanying drawings. Note that these drawings are exemplary or conceptual, so the dimensions and ratios of each drawing are not necessarily the same as real dimensions and ratios. Several embodiments to be described below represent examples of apparatuses and methods for embodying the technical idea of the present invention, and the technical idea of the present invention is not specified by the shapes, structures, and layouts of the constituent parts. Note that in the following explanation, the same reference numerals denote elements having the same functions and arrangements, and a repetitive explanation will be made only when necessary.

A nonvolatile semiconductor memory device is a semiconductor memory in which data is electrically rewritable. In the following embodiments, a NAND flash memory is explained as an example of the nonvolatile semiconductor memory device.

First Embodiment

1. Structure of NAND Flash Memory

FIG. 1 is a block diagram of a NAND flash memory 10 according to a first embodiment.

A memory cell array 11 is formed by arranging memory cells in rows and columns. Each memory cell is formed of an electrically-rewritable EEPROM cell. In the memory cell array 11, bit lines, word lines, and source lines are arranged to control the voltages of the memory cells.

A word-line control circuit 12 serving as a row decoder is connected to the word lines, and selects and drives the word line when data is read, written, and erased. A bit-line control circuit 13 is connected to the bit lines, and controls the voltage of the bit line when data is read, written, and erased. The bit-line control circuit 13 detects data of the bit line when data is read, and applies a voltage corresponding to the write data to the bit line when the data is written. A column decoder 14 generates a column select signal to select the bit line, in accordance with an output signal from an address decoder 15, and sends the column select signal to the bit line control circuit 13.

The input/output control circuit 16 receives commands CMD and address signals ADD from outside, and sends and receives data to and from the outside. When data is written, write data is sent from the input/output control circuit 16 to the bit line control circuit 13 through a data input/output buffer 17. When data is read, read data read by the bit line control circuit 13 is sent to the input/output control circuit 16 through the data input/output buffer 17, and output to the outside from the input/output control circuit 16.

The address signal ADD sent from the input/output control circuit 16 to the data input/output buffer 17 is sent to the address decoder 15. The address decoder 15 decodes the address signal ADD, sends a row address to the word line control circuit 12, and sends a column address to the column decoder 14.

The command CMD sent from the input/output control circuit 16 to the data input/output buffer 17 is sent to a control circuit (controller) 18. The control circuit 18 receives external control signals including a chip enable signal /CE, a write enable signal /WE, a read enable signal /RE, an address latch enable signal ALE, and a command latch enable signal CLE, from the outside. The control circuit 18 generates a control signal to control read operation, write operation, and erase operation, based on the external control signal and the command CMD input in accordance with the operation mode. The control signal is sent to the word line control circuit 12, the bit line control circuit 13, and a control voltage generating circuit 19. The control circuit 18 controls operations of the NAND flash memory 10, by using the control signals.

The control voltage generating circuit 19 generates voltages necessary for operations of the memory cell array 11, the word line control circuit 12, and the bit line control circuit 13, such as a read voltage, a write voltage, a verify voltage, and an erase voltage, in accordance with various control signals sent from the control circuit 18.

A parameter memory unit 20 is connected to the input/output control circuit 16 and the control circuit 18, and stores, for example, a parameter which is suitable for the chip quality and determined in a test process.

Figure 2:
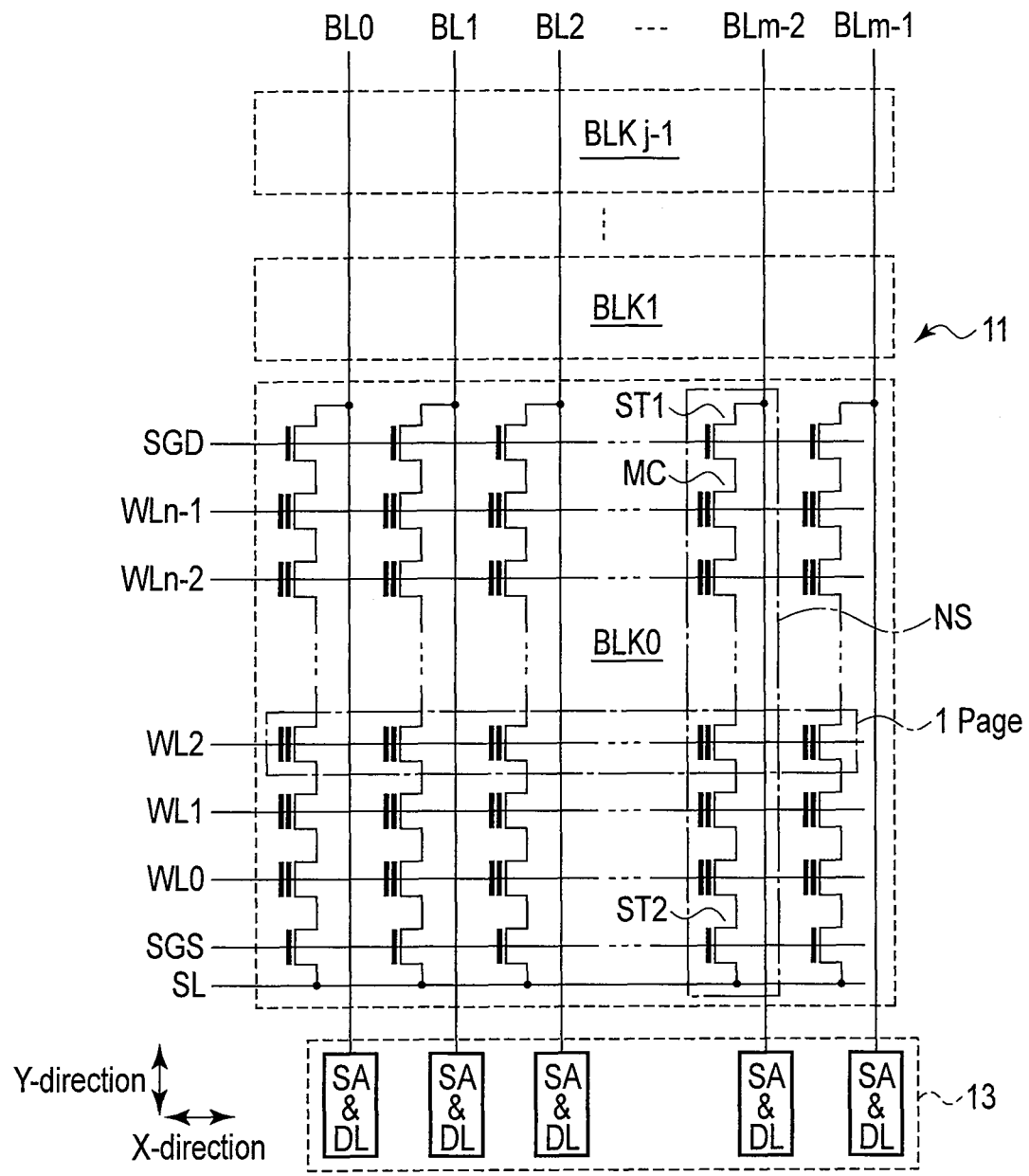
FIG. 2 is a circuit diagram of a memory cell array.

Next, the structure of the memory cell array 11 illustrated in FIG. 1 will be explained hereinafter. FIG. 2 is a circuit diagram of the memory cell array 11.

The memory cell array 11 includes a plurality of (j) blocks BLK0 to BLKj−1. Each block BLK includes a plurality of (m) NAND strings NS which are successively arranged in an X-direction. In each NAND string NS, a plurality of (n) memory cells MC are arranged between a source of a select transistor ST1 and a drain of a select transistor ST2 such that current channels of the memory cells are connected in series. A drain of select transistor ST1 included in the NAND string NS is connected to the bit line BL, and a gate of select transistor ST1 is connected to a select gate line SGD in common. A source of select transistor ST2 included in the NAND string NS is connected to the source line SL in common, and a gate of select transistor ST2 is connected to a select gate line SGS in common.

Each memory cell MC is formed of a MOSFET (Metal Oxide Semiconductor Field Effect Transistor), which is formed on a p-well and includes a stacked gate including a charge storage layer (such as a floating gate electrode). The stacked gate of the memory cell MC includes a charge storage layer formed on the p-well with a gate insulating film interposed therebetween, and a control gate electrode formed on the charge storage layer with an insulating film interposed therebetween. A threshold voltage of each memory cell MC changes according to the number of electrons which can be stored in the charge storage layer, and the memory cell MC stores data in accordance with a difference in the threshold voltage. Each memory cell MC may be configured to store binary data (1 bit), or store multi-valued data (two or more bits).

In each NAND string NS, control gate electrodes of the memory cells MC are respectively connected to word lines WL0 to WLn−1, from the memory cell MC which is closest to the source side (select transistor ST2 side). Thus, a drain of the memory cell MC connected to word line WLn−1 is connected to a source of select transistor ST1, and a source of the memory cell MC connected to word line WL0 is connected to the drain of select transistor ST2. Word lines WL0 to WLn−1 extend in the X-direction (row direction).

Each of word lines WL0 to WLn−1 connects the control gate electrodes of the memory cells MC in common between NAND strings NS in a block BLK. Specifically, control gate electrodes of the memory cells MC located in the same row in the block BLK are connected to the same word line WL. The m memory cells MC connected to the same word line WL is dealt with as a page, and data writing and reading is performed for each page.

Each of bit lines BL0 to BLm−1 connects drains of select transistors ST1 in common between blocks BLK0 to BLKj−1. Specifically, the NAND strings NS located in the same column in the blocks BLK0 to BLKj−1 are connected to the same bit line BL. Bit lines BL0 to BLm−1 extend in a Y-direction (column direction) perpendicular to the X-direction.

Each bit line BL is connected to a sense amplifier SA and a data latch DL. The sense amplifiers SA and the data latches DL are included in the bit line control circuit 13. The sense amplifier SA senses and amplifies change in potential of the bit line BL when data is read, and identifies data stored in the memory cell MC. The sense amplifier SA also charges or discharges the bit line BL, when data is written. The data latch DL temporarily stores data read from the memory cell MC and data to be written to the memory cell MC.

Next, threshold voltage distributions of a memory cell MC will be explained hereinafter. FIG. 3 is a diagram illustrating threshold voltage distributions of a memory cell MC. The horizontal axis of FIG. 3 indicates a threshold voltage Vth of the memory cell MC. FIG. 3 (a) is a diagram illustrating threshold voltage distribution of a memory cell MC, which can store binary data, that is, a single-level cell (SLC). When the memory cell MC stores binary data (one bit per cell), a lower threshold voltage (for example, a negative threshold voltage) is an erase state and, for example, binary 1 is assigned to the lower threshold voltage. A higher threshold voltage (for example, a positive threshold voltage) is a write state and, for example, binary 0 is assigned to the higher threshold voltage.

FIG. 3 (b) is a diagram illustrating threshold voltage distribution of a memory cell MC which can store multivalued data, such as a multi-level cell (MLC). Although a memory cell MC which can store two bits is explained as an example of the MLC in the following embodiments, the embodiments are applicable to memory cells which can store three or more bits, as a matter of course.

When each memory cell MC stores four values (two bits per cell), four threshold voltage distributions E, A, B, and C are provided, which are arranged in the ascending order of the threshold voltage. Data items are assigned to threshold voltage distributions E, A, B, and C.

Each of two-bit data items 11, 01, 00, and 10 is indicated by xy, which includes upper-page data x and lower-page data y. Writing of two-bit data (program) requires two program operations, that is, lower-page programming and upper-page programming.

Threshold voltage distribution E is an erase state (for example, negative threshold voltage) in which the memory cell MC has the lowest threshold voltage. When the lower-page data has been programmed to the memory cell MC, the memory cell MC is set to one of threshold voltage distribution E and a threshold voltage distribution LM (Lower Middle). The lower-page programming is an operation of selectively setting the memory cell MC having threshold voltage distribution E to threshold voltage distribution LM. The memory cell MC having threshold voltage distribution LM is, for example, a cell having lower-page data 0.

The upper-page programming includes first upper-page programming of selectively setting the memory cell having threshold voltage distribution E to threshold voltage distribution A, and second upper-page programming of selectively setting the memory cell having threshold voltage distribution LM to threshold voltage distribution B or C. By performing the lower-page programming and the upper-page programming for the memory cell MC, the memory cell MC can be set to one of threshold voltage distributions E, A, B, and C.

In addition, a read pass voltage Vread illustrated in FIG. 3 is a voltage higher than the upper limit of the highest threshold voltage distribution. Thus, the memory cell provided with the read pass voltage Vread is turned on regardless of presence/absence of the storage data. The read pass voltage Vread is a voltage which is applied to a non-selected word line in reading.

2. Operation

When data of the memory cell is programmed, an operation of applying a program pulse voltage to the memory cell and an operation of checking the threshold voltage of the memory cell are repeated, and the threshold voltage of the memory cell is set to a predetermined voltage. In this processing, the program pulse voltage is stepped up, as the number of times of programming increases. In the following explanation, an operation of applying the program pulse voltage to the word line to shift the threshold voltage of the memory cell is referred to as a program operation and an operation of checking the threshold voltage of the memory cell by using the verify voltage is referred to as a verify operation. In addition, a series of operations of repeating the program operation and the verify operation with the stepping-up program pulse voltage is referred to as a program sequence.

The quick-pass write (QPW) method has been conceived, as a method of narrowing the threshold voltage distribution width after programming, while suppressing increase in the programming time. In the QPW method, an intermediate voltage is applied to the bit line of the memory cell, which has reached a level lower than the original verify level, in the later program operations, and thereby the intensity of programming is reduced and the shift amount of the threshold voltage is reduced. Therefore, the threshold voltage distribution is narrowed.

The following is explanation of the operation of the NAND flash memory 10. The SLC and the MLC will be explained in this order.

2-1. SLC

Comparative Example

Figure 4:
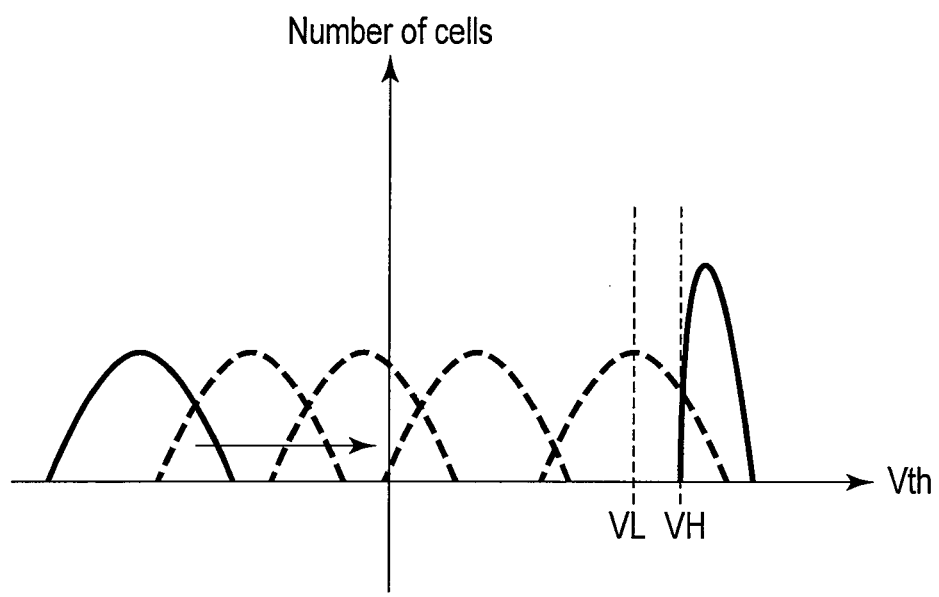
FIG. 4 is a diagram illustrating a state in which a threshold voltage of a memory cell is shifted.

First, a comparative example of the SLC will be explained hereinafter. FIG. 4 is a diagram illustrating a state in which the threshold voltage of the memory cell is shifted. FIG. 5 is a timing chart illustrating a program sequence according to the comparative example. In FIG. 4 and FIG. 5, two verify voltages VL and VH are prepared. Verify voltage VH is a lower limit value of the threshold voltage when the memory cell is set to the program state (state in which the memory cell stores binary 0). Programming of the memory cell is finished, when the threshold voltage becomes greater than or equal to verify voltage VH. Verify voltage VL is set slightly lower than verify voltage VH.

In the program operation, a program pulse voltage Vpgm is applied to the selected word line, a program pass voltage Vpass is applied to the non-selected word lines, and a power supply voltage Vdd (for example, 3V) and a ground voltage Vss (0V) are applied to select gate lines SGD and SGS, respectively. The selected word line is a word line for which programming is to be performed, and non-selected word lines are word lines for which programming is not to be performed. The program pass voltage Vpass is a non-write word line voltage which inhibits writing to memory cells connected to the non-selected word lines when the write voltage Vpgm is applied to the selected word line. The voltage Vpass is smaller than Vpgm.

Previous to the program operation, the bit line is precharged in accordance with the write data. Specifically, when binary 0 is programmed, 0V is applied to the bit line by the sense amplifier SA. The bit line voltage is transferred to the channel of the NAND string through select transistor ST1. Thus, electric charges are injected into the charge storage layer from the channel of the selected memory cell under the condition of the above program operation, and the threshold voltage of the selected memory cell is shifted to positive.

When the memory cell is maintained at an erased state (state in which the memory cell stores binary 1), the voltage Vdd is applied to the bit line by the sense amplifier SA. After the bit line voltage Vdd decreases by the threshold voltage of select transistor ST1 and is transferred to the channel of the NAND string, the channel is changed to a floating state. Thereby, the above program pulse voltage Vpgm and the program pass voltage Vpass are applied to the selected word line and the non-selected word lines, thereby the channel voltage increases by capacitive coupling, and electric charges are hardly injected into the charge storage layer. Thus, the memory cell maintains the binary 1.

Next, the verify operation will be explained. In the verify operation, verify voltage VL is applied to the selected word line, the read pass voltage Vread is applied to the non-selected word lines, and voltages Vdd and 0V are applied to select gate lines SGD and SGS, respectively. Then, after the bit line is charged to have the predetermined voltage (such as Vdd), the voltage Vdd is applied to select gate line SGS. Thereby, when the threshold voltage of the selected memory cell is greater than or equal to verify voltage VL, the bit line is hardly discharged. The bit line voltage is sensed by the sense amplifier SA, and thereby the verify operation passes. When the threshold voltage of the selected memory cell is less than verify voltage VL, the verify operation fails. Thereafter, the program operation and the verify operation are repeated, while the program pulse voltage Vpgm is increased by step-up voltage ΔV at a time.

The comparative example in FIG. 5 is an example in which the verify operation for verify voltage VL passes in the second programming, and the verify operation for verify voltage VH passes in the third programming. In the comparative example, since the verify operation using verify voltage VL is performed separately from the verify operation using verify voltage VH, the verify operation requires much time, and consequently the program sequence requires a long time.

Embodiments

Figure 6:
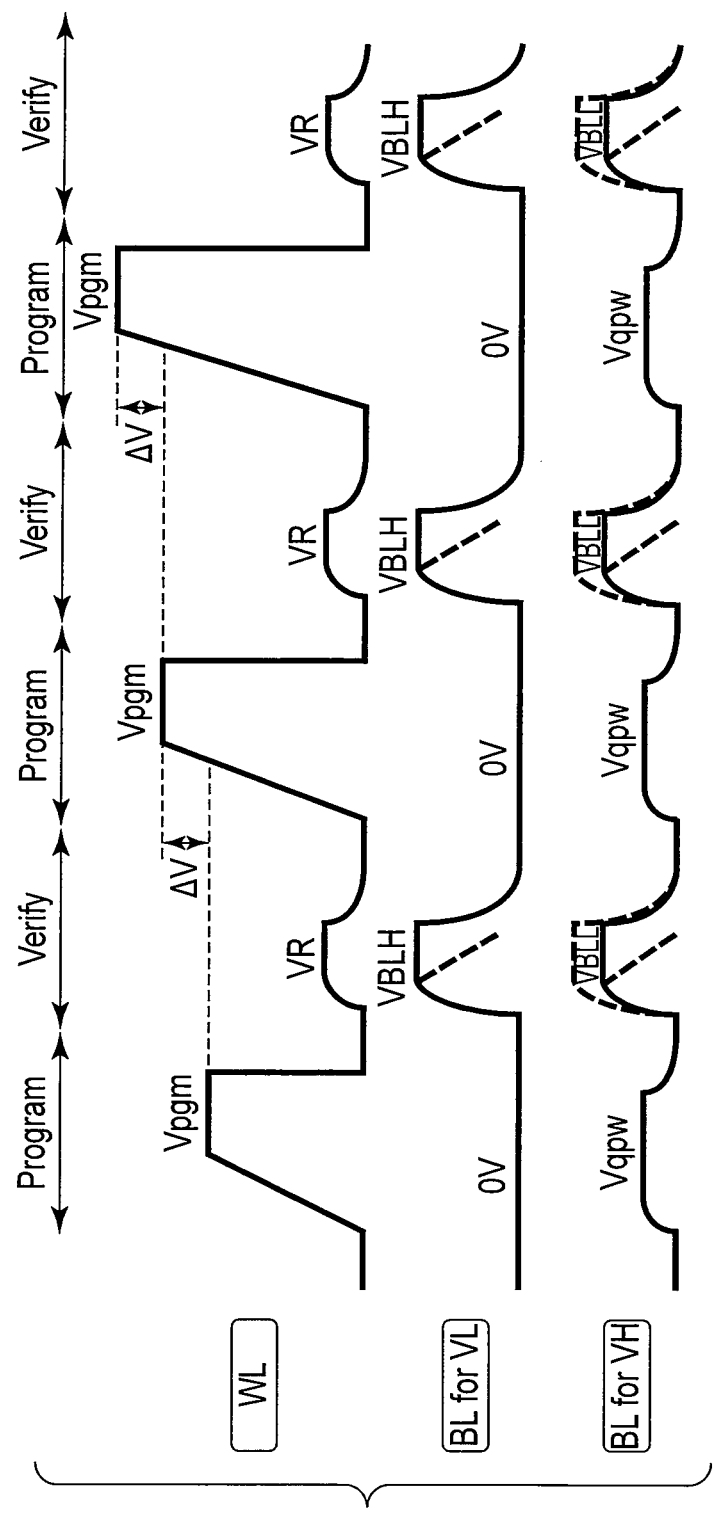
FIG. 6 is a timing chart for explaining a program sequence of an SLC according to a first embodiment.

Next, a verify operation for an SLC according to a first embodiment will be explained hereinafter. FIG. 6 is a timing chart illustrating a program sequence of the SLC according to the first embodiment. FIG. 7 is a flowchart illustrating the program sequence of the SLC according to the first embodiment.

In the first embodiment, two voltages VBLH and VBLL (VBLH>VBLL) are prepared as charge voltages for the bit line in the verify operation. When the bit line is charged to the voltage VBLH and the verify operation is performed, the time required for discharging the bit line to the predetermined voltage increases. On the other hand, when the bit line is charged to the voltage VBLL and the verify operation is performed, the time required for discharging the bit line to the predetermined voltage is shortened in comparison with the case of using VBLH. Thus, the verification for the VL level (referred to as VL verification) is achieved by verification using the voltage VBLH, and the verification for the VH level (referred to as VH verification) is achieved by verification using the voltage VBLL.

First, 0V is used as the bit line voltage VBL for the memory cell having a threshold voltage less than the VL level, and the program operation is performed (Step S10). Then, verify voltage VR is applied to the selected word line, the bit line is charged to the voltage VBLH, and the verify operation (VL verification) is performed (Step S11). For example, the same voltage as verify voltage VH in FIG. 4 is used as verify voltage VR. As a result of VL verification of Step S11, when the threshold voltage of the memory cell is less than the VL level (VL verification fails), the sequence returns to the Step S10, and program operation is performed again with the stepped-up program pulse voltage (Step S12). Since the memory cell is turned on when the threshold voltage is less than the VL level, and the bit line is discharged. The state in which the bit line is discharged is indicated by broken lines in the waveform of the bit line in FIG. 6.

As a result of VL verification in Step S11, when the threshold voltage of the memory cell is greater than or equal to the VL level (VL verification passes), program operation is performed with the bit line voltage VBL set to Vqpw (Step S13). When the threshold voltage of the memory cell is greater than or equal to the VL level, the memory cell is turned off, and thus the bit line is hardly discharged. The state in which the voltage of the bit line is maintained is indicated by solid lines of the waveform of the bit line in FIG. 6.

Next, verify voltage VR is applied to the selected word line, the bit line is charged to the voltage VBLL, and verify operation (VH verification) is performed (Step S14). The sensing time in VL verification is the same as that in VH verification. The voltages VBLH and VBLL are designed, in accordance with the characteristic (for example, discharge characteristic) of the memory cells actually manufactured and the desired sensing time in verify operation, while the relationship VBLH>VBLL is maintained. The waveform of VBLH expressed in broken lines is superposed on the waveform of VBLL in FIG. 6, to compare the voltage levels.

As a result of VH verification in Step S14, when the threshold voltage of the memory cell is less than the VH level (VH verification fails), the process returns to Step S13, and program operation is performed again with the stepped-up program pulse voltage (Step S15). On the other hand, when the threshold voltage of the memory cell is greater than or equal to the VH level (VH verification passes), the programming of the memory cell is finished. Thereafter, VH verification corresponding to the threshold voltage to be programmed passes in all the selected memory cells connected to the selected word line, the program sequence is finished.

2-2. MLC

Comparative Example

First, a comparative example relating to the MLC will be explained. FIG. 8 is a diagram illustrating verify voltages of threshold voltage distributions. As described above, the MLC can be set to one of the four threshold voltage distributions E, A, B, and C. When the memory cell is programmed to threshold voltage distribution A, the verify operation is performed by using verify voltages AVL and AVH (AVL<AVH). When the memory cell is programmed to threshold voltage distribution B, the verify operation is performed by using verify voltages BVL and BVH (BVL<BVH). When the memory cell is programmed to threshold voltage distribution C, the verify operation is performed by using verify voltages CVL and CVH (CVL<CVH). Then, the QPW method is performed by using the verify result.

Figure 9:
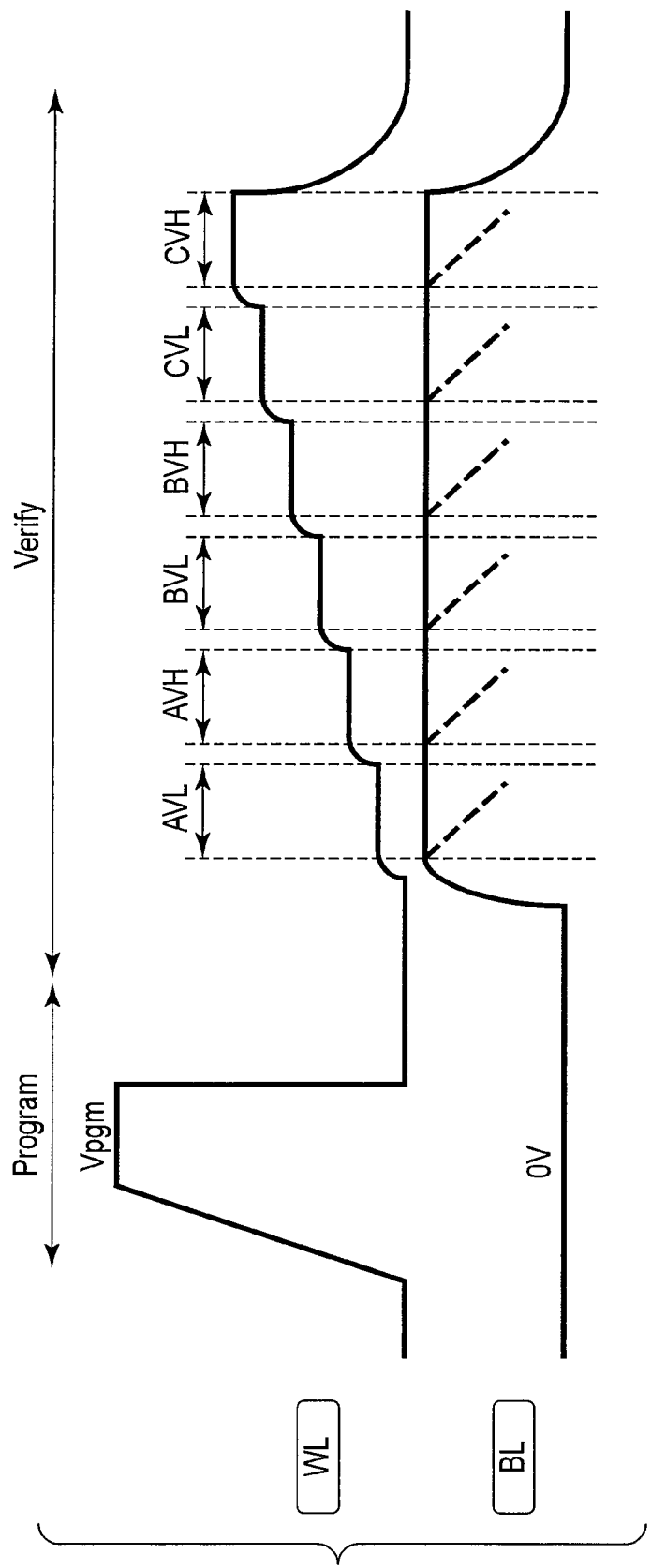
FIG. 9 is a timing chart illustrating a program sequence according to a comparative example.

FIG. 9 is a timing chart illustrating a program sequence according to the comparative example. First, program operation is performed by applying a program pulse voltage Vpgm to the selected word line and applying 0V to the bit line. Then, six verify operations are performed, in the ascending order of the verify level, that is, in the order of AVL, AVH, BVL, BVH, CVL, and CVH. Thereafter, although not illustrated, 0V or an intermediate voltage Vqpw is applied to the bit line in accordance with the verify result, and the program operation is performed.

In the comparative example of FIG. 9, sensing is performed twice in each threshold voltage distribution. This increases the program sequence time, and the program sequence time is further increased as the number of the threshold voltage distributions increases.

Embodiment

Figure 10:
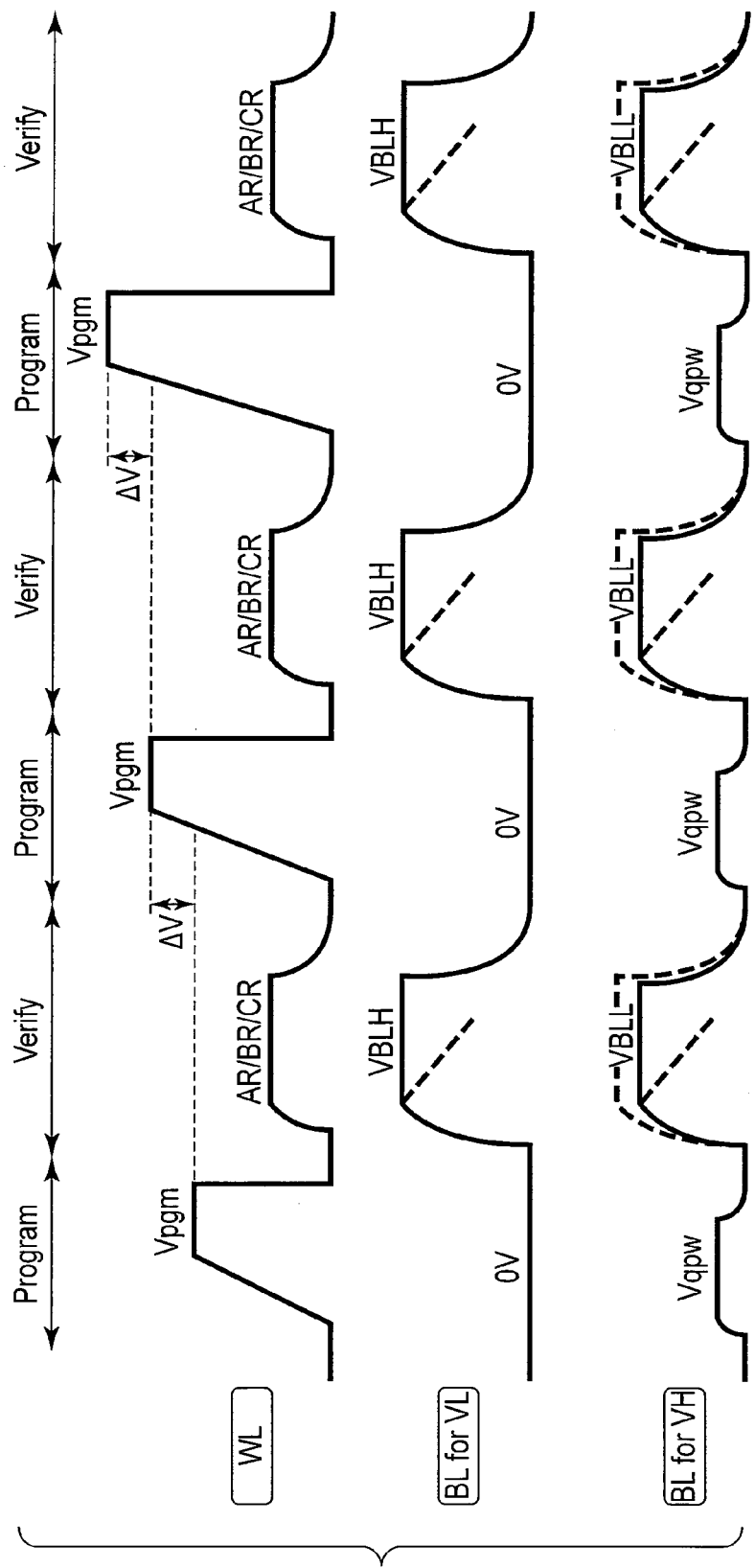
FIG. 10 is a timing chart illustrating a program sequence of an MLC according to a first embodiment.

Next, the verify operation for the MLC according to the first embodiment will be explained hereinafter. FIG. 10 is a timing chart illustrating a program sequence for the MLC according to the first embodiment. The flowchart illustrating the program sequence for the MLC is the same as FIG. 7.

First, program operation is performed for the memory cell having a threshold voltage less than the VL level, with the bit line voltage VBL of zero (Step S10). The VL level is set to an AVL level for the memory cell programmed to threshold voltage distribution A, a BVL level for the memory cell programmed to threshold voltage distribution B, and a CVL level for the memory cell programmed to threshold voltage distribution C.

Next, the verify voltage is applied to the selected word line, the bit line is charged to the voltage VBLH, and the verify operation (VL verification) is performed (Step S11). The verify voltage is AR for the memory cell programmed to threshold voltage distribution A, BR for the memory cell programmed to threshold voltage distribution B, and CR for the memory cell programmed to threshold voltage distribution C. The voltages AR, BR, and CR have the relationship AR<BR<CR. For example, the same voltages as verify voltages AVH, BVH, and CVH in FIG. 8 are used as verify voltages AR, BR, and CR, respectively.

Figure 11:
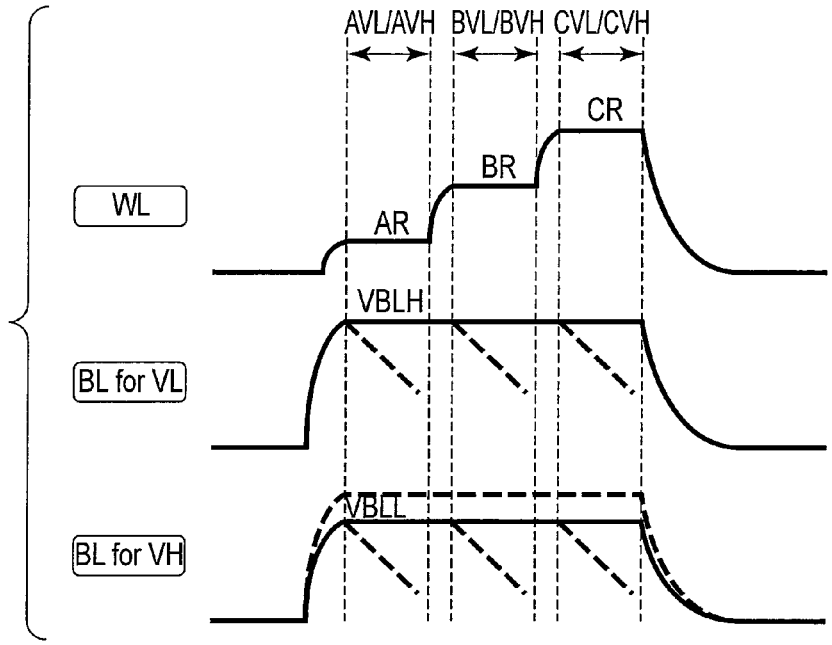
FIG. 11 is a timing chart illustrating details of a verify operation in FIG. 10.

FIG. 11 is a timing chart illustrating details of the verify operation of FIG. 10. In the verify operation for the VL level, AVL verification, BVL verification, and CVL verification are successively performed. When the VL verification in Step S11 fails, the process returns to Step S10, and the program operation is performed again with the stepped-up program pulse voltage (Step S12).

When the VL verification in Step S11 passes, the program operation is performed with the bit line voltage VBL of Vqpw (Step S13). Then, verify voltages AR, BR, and CR are successively applied to the selected word line, the bit line is charged to the voltage VBLL, and the verify operation (VH verification) is performed (Step S14).

When the VH verification in Step S14 fails, the processes returns to Step S13, and the program operation is performed again with the stepped-up program pulse voltage (Step S15). On the other hand, when the VH verification passes, the programming for the memory cell is finished. Thereafter, VH verification corresponding to the threshold voltage to be programmed passes in all the selected memory cells connected to the selected word line, the program sequence is finished.

3. Effect

As detailed above, according to the first embodiment, the charge voltage for the bit line is changed between the VL verification and the VH verification. Specifically, the charge voltage for the bit line for VH verification is set lower than the charge voltage for the bit line for the VL verification. In addition, in the VL verification and the VH verification corresponding to each threshold voltage distribution, a fixed verify voltage is applied to the selected word line.

Thus, according to the first embodiment, two verifications having different verify levels can be achieved. In addition, it is possible to perform VL verification and VH verification corresponding to each threshold voltage distribution in parallel (simultaneously). Thereby, the verify time is shortened to almost half of the comparative example, and thus the program sequence time can be shortened.

In addition, since the shift amount of the threshold voltage can be reduced after the VL verification passes, each threshold voltage distribution can be narrowed. As a result, a distance between adjacent threshold voltage distributions can be increased, and thus more accurate read operation can be achieved.

Second Embodiment

In a second embodiment, a charge voltage for a bit line in VH verification is set lower than that in VL verification like the first embodiment, and the sensing time is set different between VL verification and VH verification.

Figure 12:
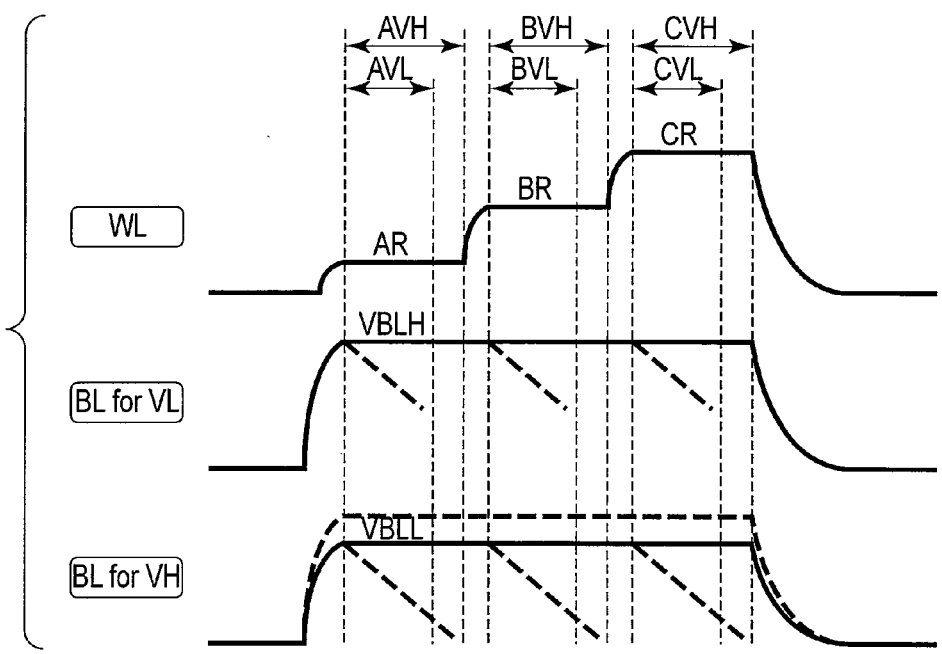
FIG. 12 is a timing chart illustrating a verify operation according to a second embodiment.

FIG. 12 is a timing chart illustrating verify operation according to the second embodiment. In the second embodiment, the sensing time for VH verification (including AVH verification, BVH verification, and CVH verification) is set longer than the sensing time for VL verification (including AVL verification, BVL verification, and CVL verification). In addition, like the first embodiment, a charge voltage VBLL for the bit line in VH verification is set lower than a charge voltage VBLH for the bit line in VL verification. Sensing is started at the same timing in VL verification and VH verification.

Therefore, according to the second embodiment, VL verification and VH verification are performed in parallel, and thus the verify time can be shortened. In addition, since the sensing time for VL verification and the sensing time for VH verification can be set separately, the accuracy of the sensing operation in VL verification and VH verification can be improved. As a result, the QPW method can be achieved with more accuracy.

Third Embodiment

In the memory cell array, memory cells having good programming characteristics (memory cells to which data is written rapidly) are mixed with memory cells having poor programming characteristics (memory cells to which data is written slowly). Thus, according to the third embodiment, a specific memory cell, for which VH verification does not pass even after programming is performed a predetermined number of times, is switched to VL verification, to finish verification for the specific memory cell earlier.

FIG. 13 is a timing chart illustrating a program sequence according to a third embodiment. FIG. 14 is a flowchart illustrating the program sequence according to the third embodiment. The flowchart of FIG. 14 is obtained by adding Steps S20 to S22 to the flowchart of FIG. 7 explained in the first embodiment. In the program sequence, an operation of applying a program pulse voltage (program operation) is repeated a plurality of times. Each of the program operations, which is a repeat unit of the program sequence, is referred to as a program loop (or simply a loop).

When VL verification in Step S11 passes, the program operation is performed with a bit line voltage VBL of Vqpw (Step S13). Then, it is determined whether the number of program loops is less than or equal to a predetermined number M (Step S20). When the number of program loops is less than or equal to M, Steps S14 and S15 are performed in the same manner as the first embodiment.

When the number of program loops exceeds M in Step S20, VL verification is performed (Step S21). Specifically, verify voltages AR, BR, and CR are successively added to the selected word line, the bit line is charged to a voltage VBLH, and verify operation is performed (Step S22). When VL verification in Step S21 fails, the process returns to Step S13, and program operation is performed again with a stepped-up program pulse voltage. On the other hand, when VL verification passes, programming of the memory cell is finished.

The program sequence time is shortened when the number M is reduced, and the program sequence time is increased when the number M is increased. The number M can be set to a desired number in accordance with the desired specification. The number M can be changed in accordance with the number of rewritings and the deterioration degree of the memory cell.

As detailed above, according to the third embodiment, when the number of program loops exceeds the predetermined number M, the memory cell is switched to VL verification even when VH verification is being executed. Thereby, the program sequence can be finished earlier. In particular, it is possible to prevent excessive repetition of the program loop for a specific memory cell (for example, memory cells having poor programming characteristics), and consequently shorten the program sequence time. In addition, it is possible to reduce the number of non-selected writings to memory cells having threshold voltage distribution E and memory cells, for which writing is finished, and avoid occurrence of erroneous writings.

<Modification>

Figure 15:
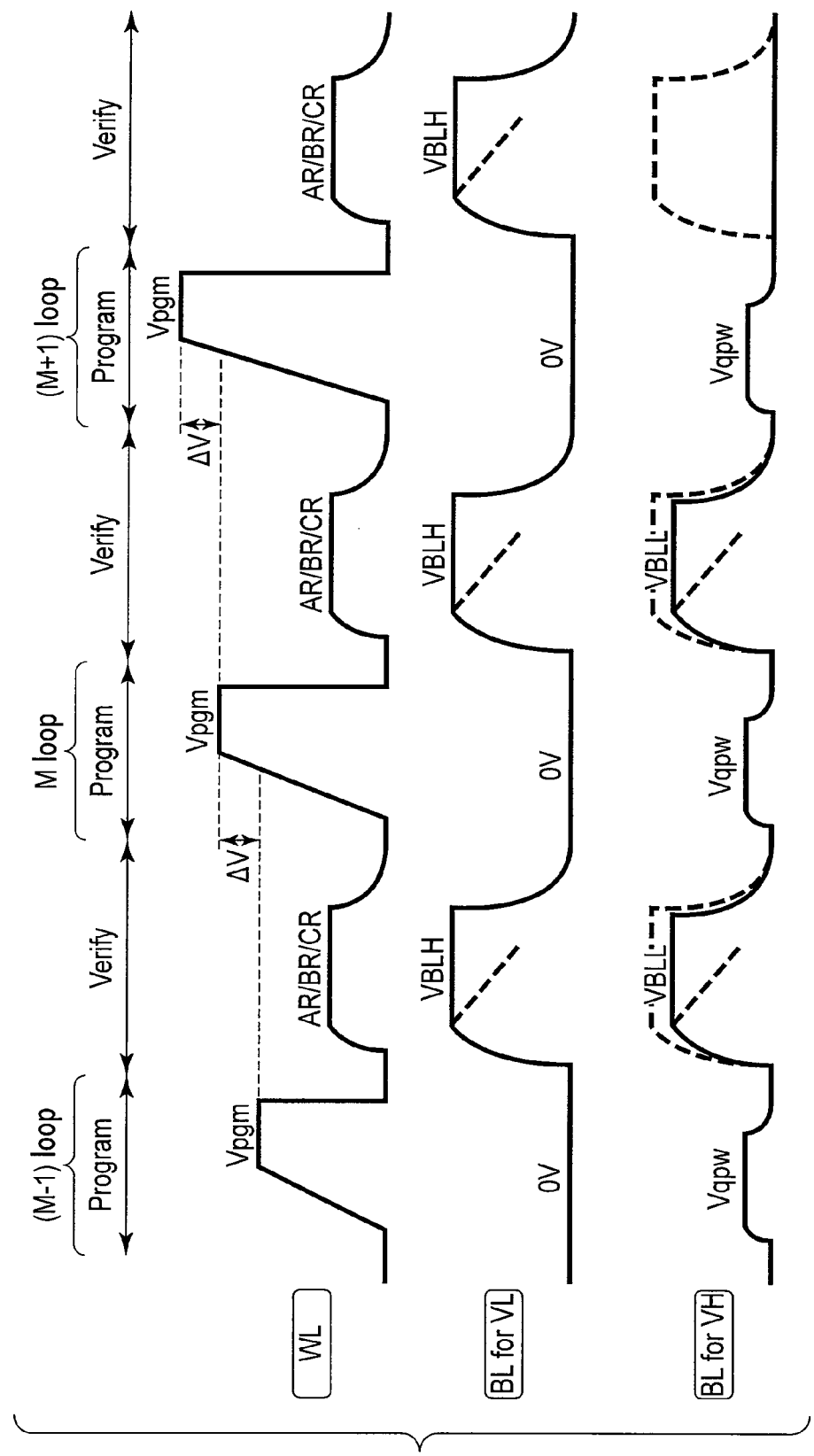
FIG. 15 is a timing chart illustrating a program sequence according to a modification.

VL verification for a memory cell to be subjected to VL verification in Step S21 has passed once in Step S12. Thus, when the number of program loops exceeds the predetermined number M, the program sequence may be finished immediately. FIG. 15 is a timing chart illustrating a program sequence in the modification. FIG. 16 is a flowchart illustrating the program sequence in the modification.

In FIG. 16, when the number of program loops exceeds M (Step S20), programming for a memory cell to be subjected to VH verification (memory cell for which VL verification has passed) is finished. Specifically, in the modification, Steps S21 and S22 of FIG. 14 are deleted. According to the modification, the program sequence time can be more shortened. In addition, it is possible to reduce the number of non-select writings to a memory cell having threshold voltage distribution E and a memory cell, for which writing is finished, and avoid occurrence of erroneous writings.

Fourth Embodiment

According to a fourth embodiment, a bit line voltage in programming for a specific memory cell, for which VH verification does not pass even when a predetermined number of program loops are executed, is switched from an intermediate voltage Vqpw to zero, to finish programming for the specific memory cell earlier.

Figure 18:
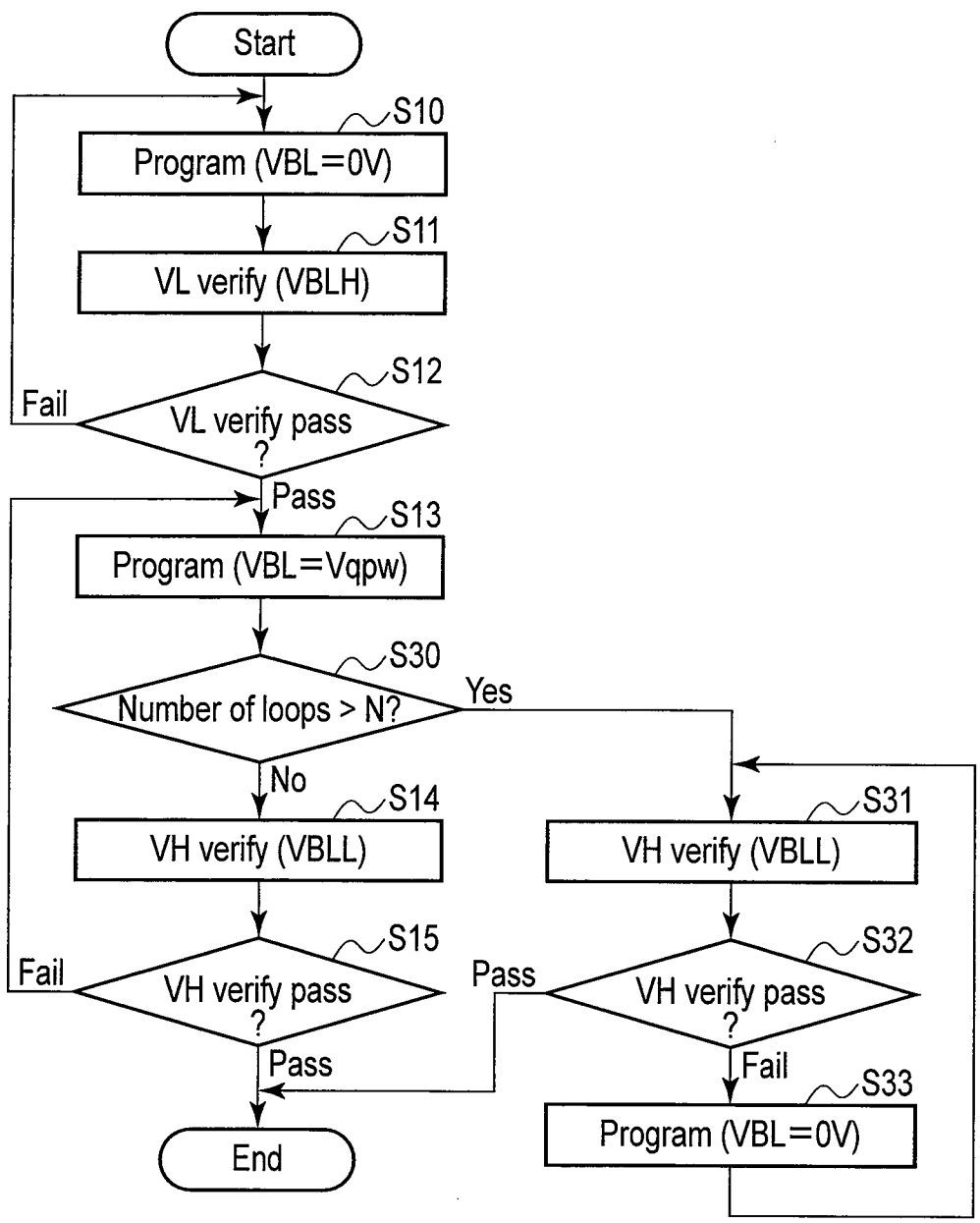
FIG. 18 is a flowchart illustrating the program sequence according to the fourth embodiment.

FIG. 17 is a timing chart illustrating a program sequence according to the fourth embodiment, and FIG. 18 is a flowchart illustrating the program sequence according to the fourth embodiment. The flowchart of FIG. 18 is obtained by adding Steps S30 to S33 to the flowchart of FIG. 7 explained in the first embodiment.

When VL verification in Step S11 passes, program operation is performed with a bit line voltage VBL of Vqpw (Step S13). Then, it is determined whether the number of program loops is less than or equal to a predetermined number N or not (Step S30). When the number of program loops is less than or equal to N, Steps S14 and S15 are performed in the same manner as the first embodiment.

When the number of program loops exceeds N in Step S30, VH verification is performed first in the same manner as Steps S14 and S15 (Steps S31 and S32). When VH verification in Step S32 fails, program operation is performed with a bit line voltage VBL set to zero (Step S33). The program operation in Step S33 can increase the shift amount of the threshold voltage of the memory cell. Thereafter, program operation is repeated with the bit line voltage VBL of zero, until VH verification passes.

The program sequence time is shortened when the number N is reduced, and the program sequence time is increased when the number N is increased. The number N can be set to a desired number in accordance with the desired specification. The number N can be changed in accordance with the number of rewritings and the deterioration degree of the memory cell.

As detailed above, according to the fourth embodiment, when the number of program loops exceeds the predetermined number N, program operation is performed with the bit line voltage VBL of zero. Thereby, the program sequence can be finished earlier. In particular, it is possible to prevent excessive repetition of the program loop for a specific memory cell (for example, memory cells having poor programming characteristics), and consequently shorten the program sequence time. In addition, it is possible to reduce the number of non-selected writings to memory cells having threshold voltage distribution E and memory cells, for which writing is finished, and avoid occurrence of erroneous writings.

<Modification>

Figure 19:
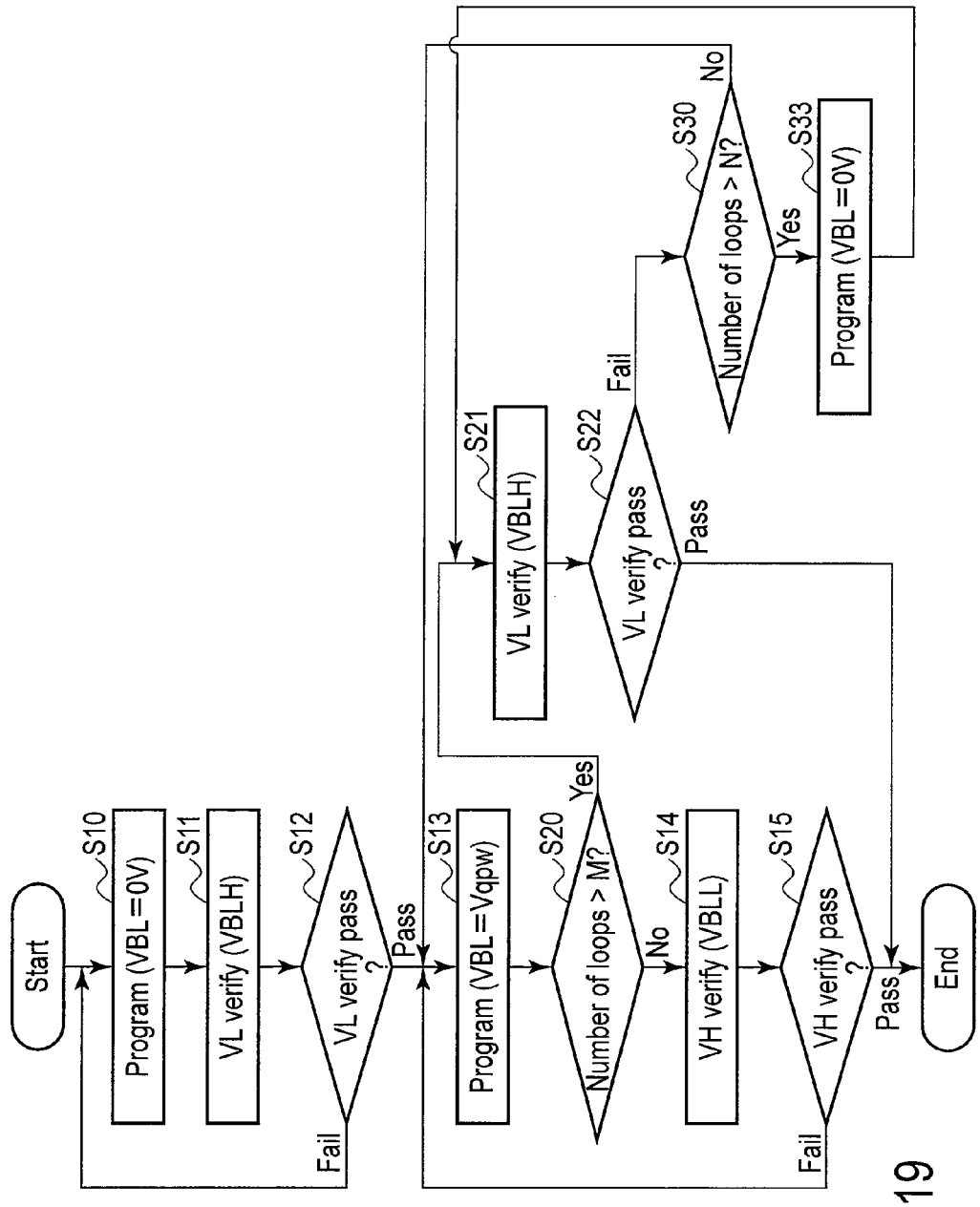
FIG. 19 is a flowchart illustrating a program sequence according to a modification.

The third embodiment may be combined with the fourth embodiment. FIG. 19 is a flowchart illustrating a program sequence according to the modification.

The steps up to Step S22 are the same as those illustrated in FIG. 14 of the third embodiment. When VL verification in Step S22 fails, the same steps as the fourth embodiment are performed. Specifically, it is determined whether the number of program loops is less than or equal to the predetermined number N (Step S30). When the number of program loops is less than or equal to N, the process returns to Step S13, and program operation is performed with the bit line voltage VBL of Vqpw.

When the number of program loops exceeds N in Step S30, program operation is performed with the bit line voltage VBL of zero (Step S33). Thereafter, program operation is repeated with the bit line voltage VBL of zero, until VL verification passes by Steps S21 and S22.

Although the modification of FIG. 19 is based on the assumption that the numbers of program loops have the relationship M<N, M may be equal to N. The numbers M and N may be changed for each of the three write states corresponding to threshold voltage distributions A, B, and C. Specifically, the numbers M and N are increased as the threshold voltage increases.

The processing order of the third embodiment and the fourth embodiment may be exchanged. FIG. 20 is a flowchart illustrating a program sequence according to another modification.

The steps up to Step S32 are the same as those in FIG. 18 of the fourth embodiment. After program operation is performed in Step S33 with the bit line voltage VBL of zero, the same steps as those of the third embodiment are performed. Specifically, it is determined whether the number of program loops is less than or equal to the predetermined number M (Step S20). When the number of program loops is less than or equal to M, VH verification is performed in Step S31.

When the number of program loops exceeds M in Step S20, VL verification is preformed (Step S21). Thereafter, program operation is repeated with the bit line voltage VBL of zero, until VL verification passes in Step S21 and S22.

Although the modification of FIG. 20 is based on the assumption that the numbers of program loops have the relationship M>N, M may be equal to N. The numbers M and N may be changed for each of the three write states corresponding to threshold voltage distributions A, B, and C. Specifically, the numbers M and N are increased as the threshold voltage increases.

Fifth Embodiment

Since the program pulse voltage Vpgm is at low level in the program operation performed at the initial stage of the program sequence, the number of memory cells which pass verification is small. Thus, according to the fifth embodiment, verify operation is omitted in the program loop performed at the initial stage of the program sequence.

FIG. 21 is a timing chart illustrating a program sequence according to the fifth embodiment. FIG. 22 is a flowchart illustrating the program sequence according to the fifth embodiment. The flowchart of FIG. 22 is obtained by adding Step S40 to the flowchart of FIG. 7 explained in the first embodiment.

First, program operation is performed with a bit line voltage VBL of zero, for a memory cell having a threshold voltage less than VL level (Step S10). Then, it is determined whether the number of program loops is less than or equal to a predetermined number M (Step S40). When the number of program loops is less than or equal to M in Step S40, the process returns to Step S10, and program operation is performed with the bit line voltage VBL of zero. On the other hand, when the number of program loops exceeds M in Step S40, VL verification is performed (Step S11).

As described above, while the number of program loops is less than or equal to the predetermined number M, verify operation is omitted, since the number of memory cells which pass VL verification is small. This structure shortens the program sequence time.

The number M may be changed for each of the three write states corresponding to threshold voltage distributions A, B, and C. Specifically, the number M is increased as the threshold voltage increases.

Sixth Embodiment

When program operations are successively performed as in the fifth embodiment, a memory cell for which writing is finished rapidly may have a threshold voltage which passes VH verification. Thus, in the sixth embodiment, VL verification and VH verification are performed in parallel in a first verification operation of the program sequence.

FIG. 23 is a timing chart illustrating a program sequence according to the sixth embodiment. FIG. 24 is a flowchart illustrating the program sequence according to the sixth embodiment.

First, program loops are performed as in the fifth embodiment (Steps S10 and S40). Then, VL verification and VH verification are performed in parallel (Step S41). Specifically, the bit line is charged to a voltage VBLH, and the sensing time for VH verification is set longer than the sensing time for VL verification. Thereby, the bit line voltage in VH verification is set lower than that of VL verification, and VH verification becomes harder to pass than VL verification. As a result, the charge voltages for the bit lines are made the same, and the VL level and the VH level can be sensed by one verify operation.

As a result of verification in Step S41 (Step S42), when both the VL verification and the VH verification fail, program operation is performed with a bit line voltage VBL of zero (Step S43). When the VL verification passes and the VH verification fails, program operation is performed with the bit line voltage VBL set to Vqpw (Step S13). When both the VL verification and the VH verification pass, programming of the memory cell is finished.

As described above, after program loops are performed, VL verification and VH verification are performed in parallel in one verify operation, and thus the number of verifies can be reduced. This structure shortens the program sequence time.

Seventh Embodiment

Figure 25:
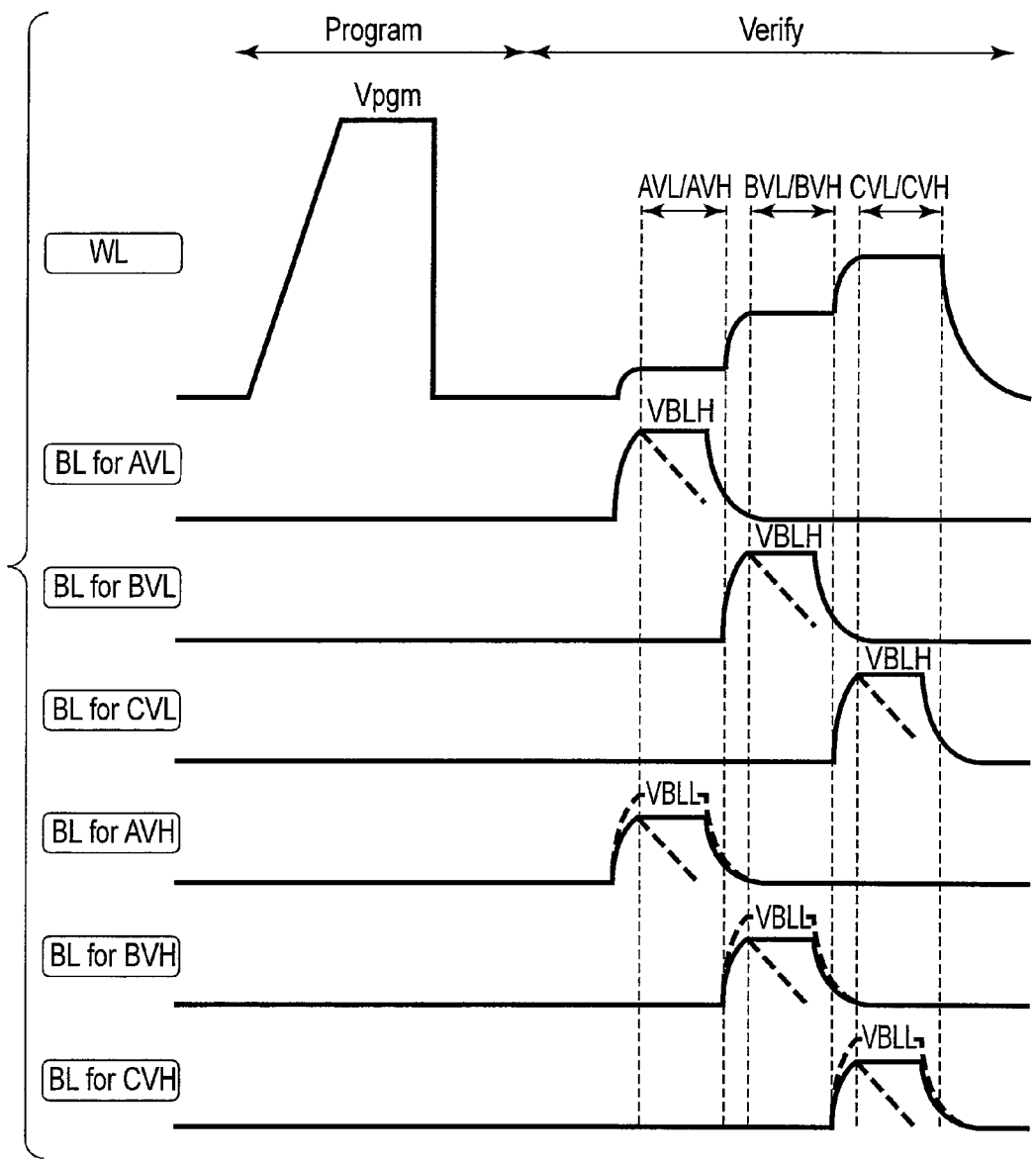
FIG. 25 is a timing chart illustrating a verify operation according to a seventh embodiment.

FIG. 25 is a timing chart illustrating verify operation according to a seventh embodiment. An MLC which can store two bits has three program states (threshold voltage distributions A, B, and C), and six verify states (AVL, AVH, BVL, BVH, CVL, and CVH) by using the QPW method. In the verify operation, each bit line is charged to a voltage for the verify state corresponding to the bit line.

According to the seventh embodiment, as illustrated in FIG. 25, the bit line is charged only during a period for checking the verify state corresponding to the bit line, and charging of the bit line is finished when sensing in verification is finished. VBLH is used as the charge voltage for the bit line in VL verification, and VBLL is used as the charge voltage for the bit line in VH verification, in the same manner as the above embodiments.

Thus, according to the seventh embodiment, control can be performed to avoid application of an unnecessary voltage to the bit line, and thus the power consumption of the NAND flash memory 10 is reduced.

Eighth Embodiment

In program operation, word lines are programmed in an ascending order. In this case, at the point in time when a selected word line WLn is programmed, a word line WLn+1 which is adjacent to the selected word line WLn has not yet been programmed. Thereafter, when word line WLn+1 is programmed, the threshold voltage of a memory cell connected to the selected word line WLn is shifted due to inter-cell interference.

Thus, before data of the selected memory cell connected to the selected word line WLn is read, data is read from an adjacent memory cell connected to word line WLn+1, and the level of a read pass voltage Vread to be applied to word line WLn+1 is changed in accordance with the data of the adjacent memory cell. Thereby, the threshold voltage of the selected memory cell can be set close to the voltage in programming, and read operation can be accurately performed. A correction read method like this is referred to as direct look ahead (DLA).

Figure 26:
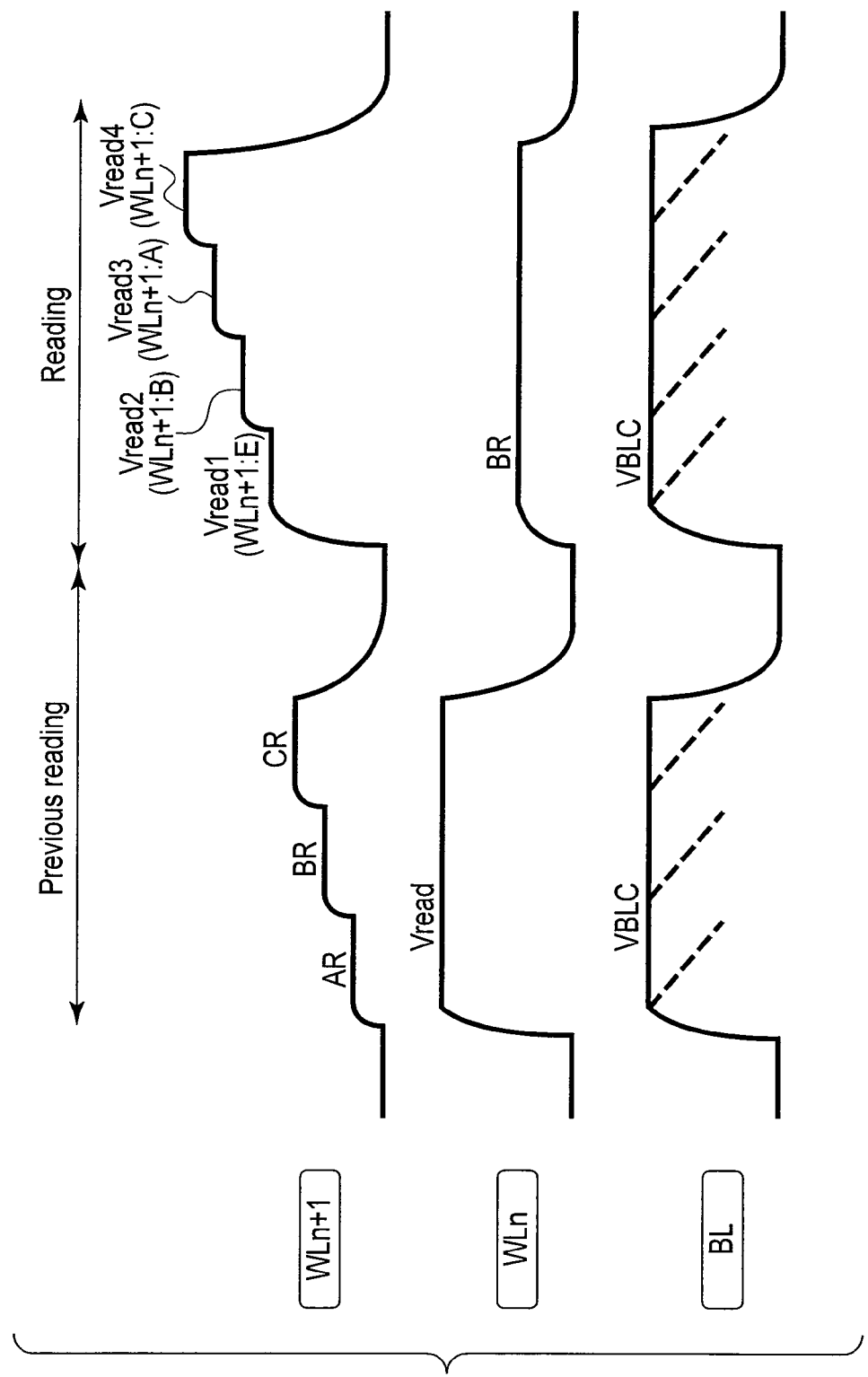
FIG. 26 is a timing chart illustrating a read operation according to a comparative example.

FIG. 26 is a timing chart illustrating read operation according to a comparative example. Word line WLn is a selected word line, from which data is to be read. In the comparative example, an operation of reading lower-page data is explained as an example.

As the order of programming, for example, after a lower page is programmed to word line WLn+1, an upper page is programmed to word line WLn, to reduce inter-cell interference from the adjacent word line to a minimum. Thus, when an upper page is programmed to a memory cell in which a lower page has already been programmed, the shift amount of the threshold voltage of the memory cell programmed to have threshold voltage distribution A or C particularly increases. Specifically, when an upper page is programmed to a memory cell in which a lower page has already been programmed, the shift amount of the threshold voltage increases in the order of threshold voltage distributions E, B, A, and C.

Correspondingly, after an upper page is programmed to the adjacent word line, the shift amount of the threshold voltage of the selected memory cell, an adjacent memory cell of which has been programmed to threshold voltage distribution A or C, particularly increases, and the shift amount of the threshold voltage of the selected memory cell increases in the order of threshold voltage distributions E, B, A, and C of the adjacent memory cell. Thus, in correction reading, the correction amount of the read pass voltage to be applied to word line WLn+1 is gradually increased, in the order of threshold voltage distributions E, B, A, and C.

As illustrated in FIG. 26, first, a previous read operation is performed previous to a read operation. In the previous read operation, read voltages AR, BR, and CR are successively applied to word line WLn+1, a read pass voltage Vread is applied to word lines other than word line WLn+1, and the bit line BL is charged to a predetermined voltage VBLC. Thereby, it is determined whether to turn on/off the adjacent memory cell connected to word line WLn+1, for each of the read voltages AR, BR, and CR, and data of the adjacent memory cell is read. The read voltages AR, BR, and CR are the same as, for example, verify voltages AR, BR, and CR, respectively.

Then, read operation is performed. In lower-page reading, the read voltage BR is used. In the read operation, the read voltage BR is applied to the selected word line WLn, and the bit line BL is charged to a predetermined voltage VBLC. Read pass voltages Vread1, Vread2, Vread3, and Vread4 (Vread1<Vread2<Vread3<Vread4) are successively applied to word line WLn+1. Vread 1, Vread2, Vread3, and Vread4 are read pass voltages which are used when the adjacent memory cell is programmed to threshold voltage distributions E, B, A, and C, respectively. Thereby, correction reading in accordance with the data of the adjacent memory cell is achieved. In the Comparative Example, read operations using the four read pass voltages Vread 1, Vread2, Vread3, and Vread4 are performed individually, and thus the read time increases.

The following is explanation of read operation according to the embodiment. An operation of reading lower-page data (lower-page read), an operation of reading upper-page data (upper-page read), and an operation of reading lower-page and upper-page at the same time (sequential read) will be explained in this order.

[1. Lower-Page Read]

Figure 27:
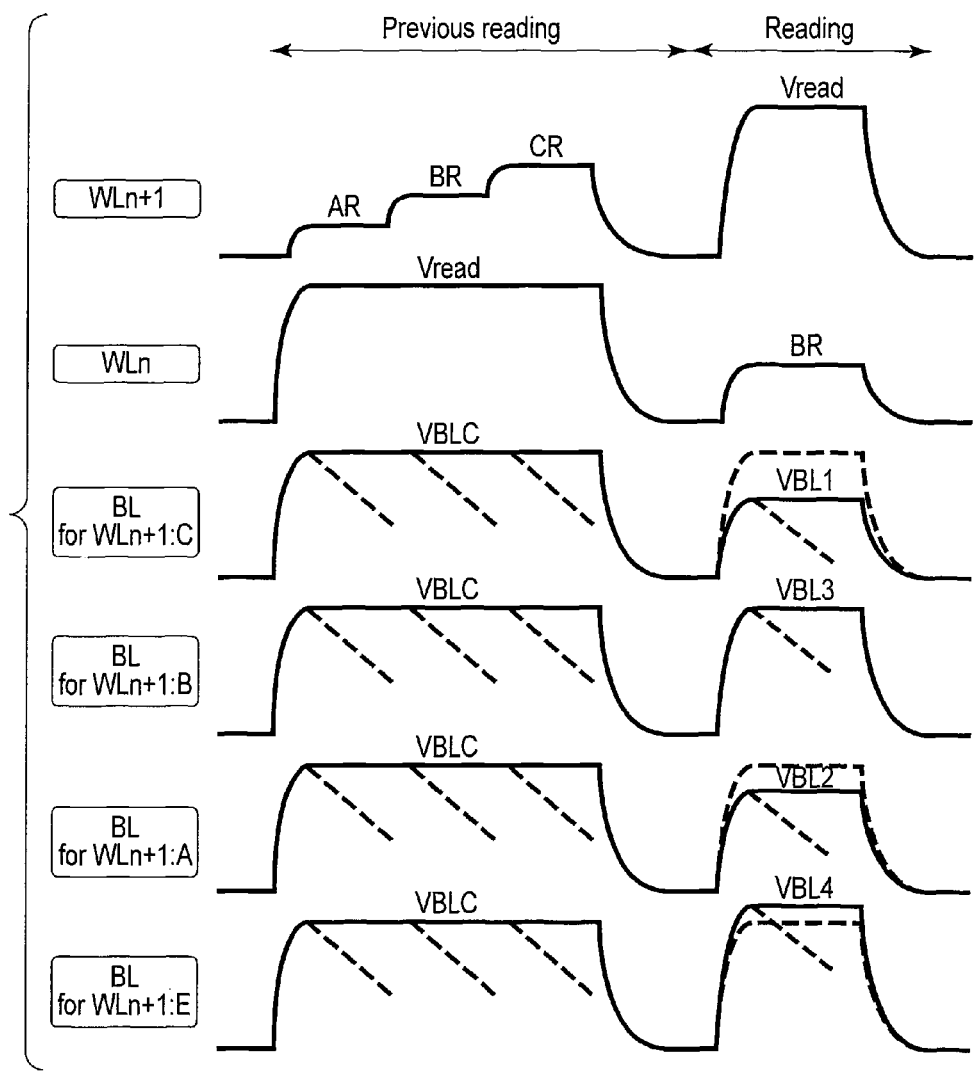
FIG. 27 is a timing chart illustrating a lower-page read operation according to an eighth embodiment.

FIG. 27 is a timing chart illustrating a lower-page read operation according to the eighth embodiment. First, a previous read operation is performed previous to the read operation, in the same manner as the comparative example. Next, a read operation (correction read operation) is performed. FIG. 27 illustrates bit-line waveforms corresponding to the cases where the threshold voltages of the adjacent memory cell connected to word line WLn+1 are E, A, B, and C.

In the read operation, the read voltage BR to read a lower page is applied to the selected word line WLn, and the read pass voltage Vread is applied to the other word lines (including word line WLn+1). The bit line which corresponds to the selected memory cell, an adjacent memory cell of which has a threshold voltage of C, is charged to VBL1. The bit line which corresponds to the selected memory cell, an adjacent memory cell of which has a threshold voltage of A, is charged to VBL2. The bit line which corresponds to the selected memory cell, an adjacent memory cell of which has a threshold voltage of B, is charged to VBL3. The bit line which corresponds to the selected memory cell, an adjacent memory cell of which has a threshold voltage of E, is charged to VBL4. Bit line voltages VBL1, VBL2, VBL3, and VBL4 have a relationship VBL1<VBL2<VBL3<VBL4. For example, VBL3 is equal to VBLC. The waveform of VBL3 is superposed on the waveforms of the VBL1, VBL2, and VBL4 in FIG. 27, to compare the voltage level.

Thereby, correction is performed to further lower the bit line voltage of a memory cell having a larger shift amount of the threshold voltage due to inter-cell interference in sensing. Thus, correction reading is achieved. In addition, it is possible to simultaneously perform correction readings corresponding to threshold voltage distributions E, A, B, and C.

[2. Upper-Page Read]

Figure 28:
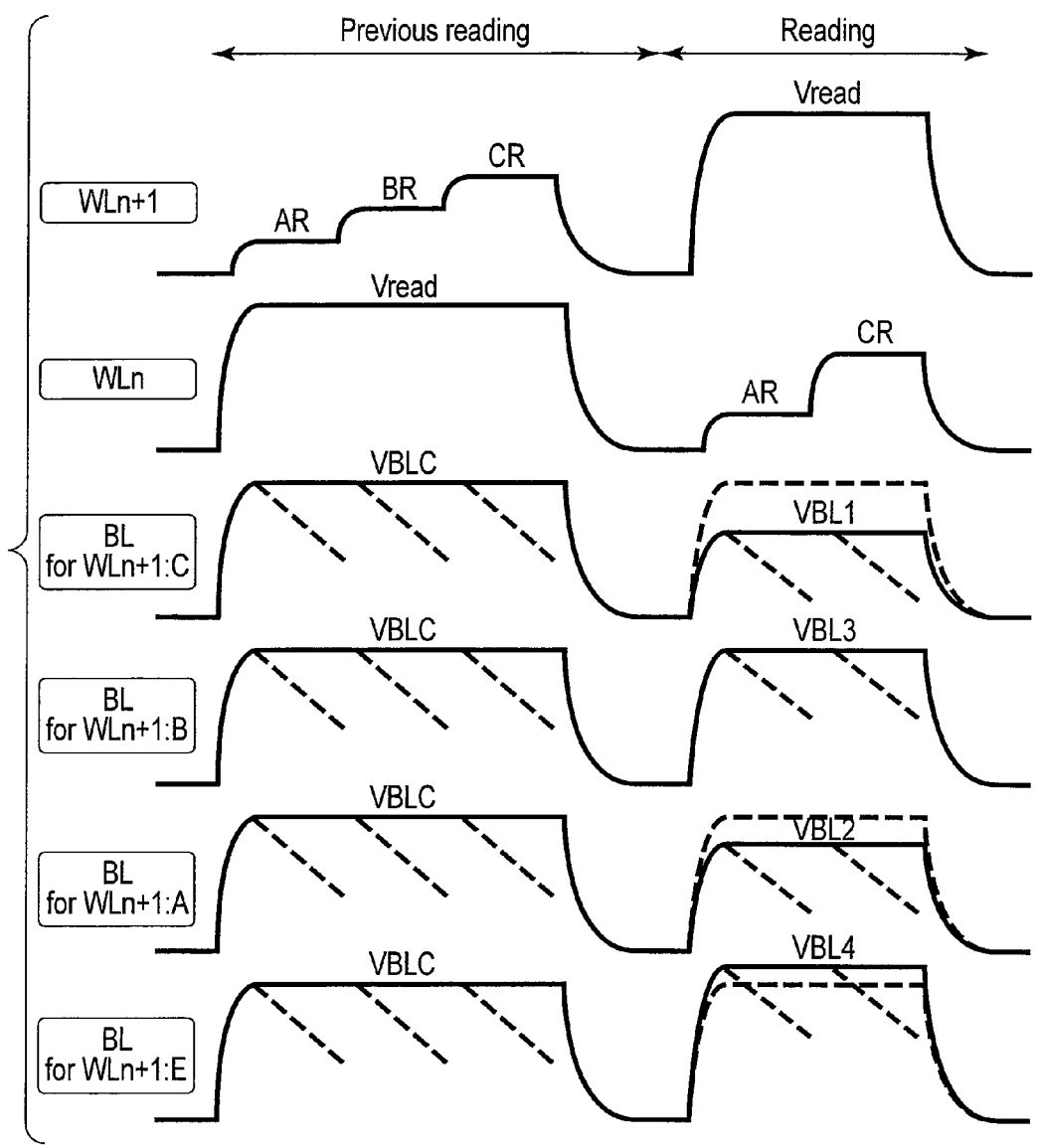
FIG. 28 is a timing chart illustrating an upper-page read operation according to the eighth embodiment.

FIG. 28 is a timing chart illustrating an upper-page read operation according to the eighth embodiment. The upper-page data is determined by sensing results using read voltages AR and CR.

First, previous read operation is performed previous to the read operation, in the same manner as the comparative example. Then, the read operation (correction read operation) is performed. In the read operation, read voltages AR and CR to read the upper page are successively applied to the selected word line WLn, and the read pass voltage Vread is applied to the other word lines (including word line WLn+1). The charge voltage for the bit line BL is the same as that in the lower-page read. The bit line is charged to the same voltage, during read periods using the read voltages AR and CR.

Thereby, it is possible to simultaneously perform correction readings corresponding to threshold voltage distributions E, A, B, and C, in each of the read operations using the respective read voltages AR and CR.

[3. Sequential Read]

Figure 29:
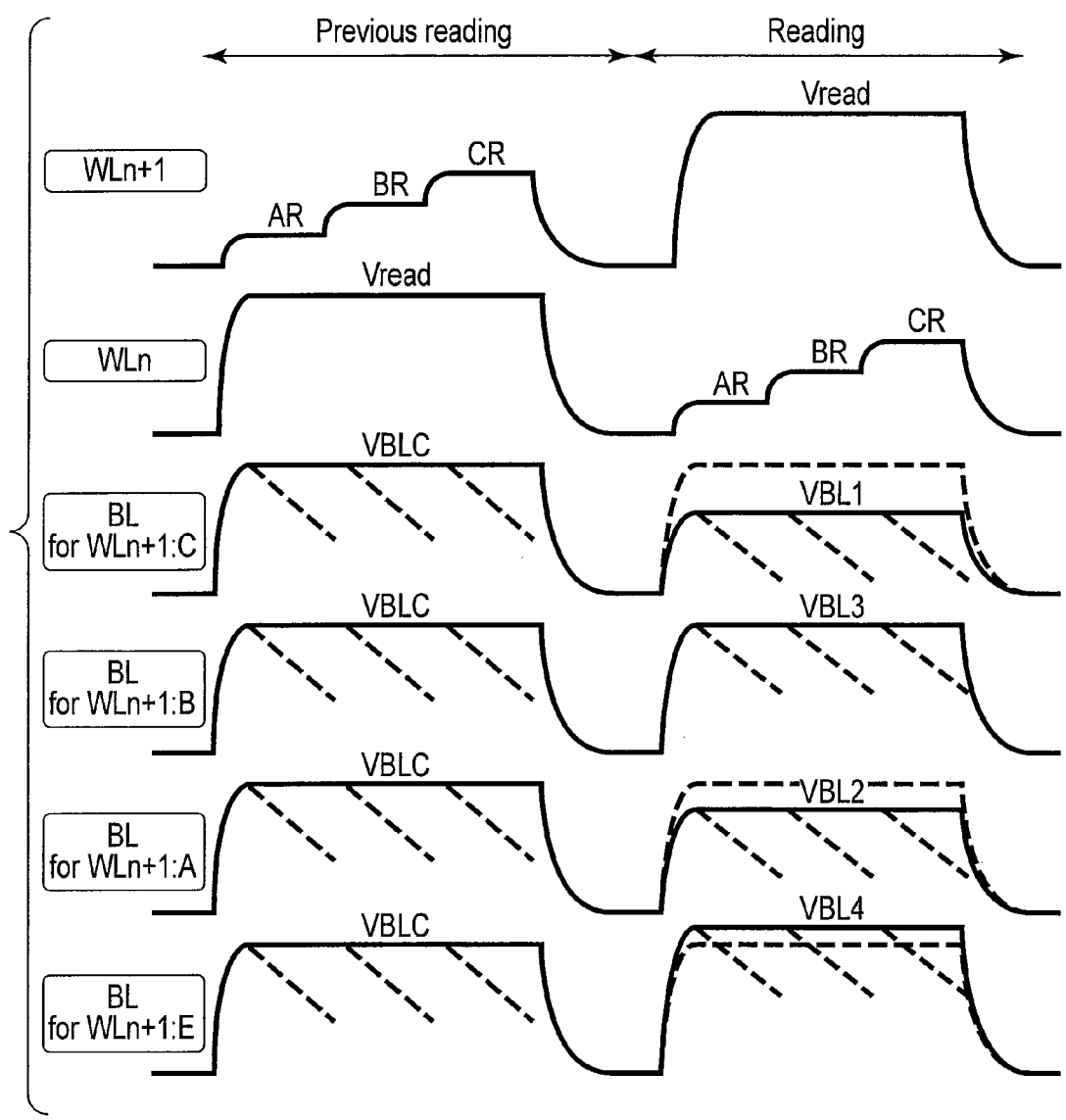
FIG. 29 is a timing chart illustrating a sequential read operation according to the eighth embodiment.

FIG. 29 is a timing chart illustrating a sequential read operation according to the eighth embodiment. In sequential reading, lower-page data and upper-page data are read simultaneously, and the lower-page data and the upper-page data are determined by sensing results using the read voltages AR, BR, and CR.

First, previous read operation is performed previous to the read operation, in the same manner as the comparative example. Then, the read operation (correction read operation) is performed. In the read operation, read voltages AR, BR, and CR are successively applied to the selected word line WLn, and the read pass voltage Vread is applied to the other word lines (including word line WLn+1). The charge voltage for the bit line BL is the same as that in the lower-page read. The bit line is charged to the same voltage, during read periods using the read voltages AR, BR, and CR.

Thereby, it is possible to simultaneously perform correction readings corresponding to threshold voltage distributions E, A, B, and C, in each of the read operations using the respective read voltages AR, BR, and CR.

[4. Effects]

As detailed above, according to the eighth embodiment, the charge voltage for the bit line is changed, in accordance with data of the adjacent memory cell connected to the adjacent word line WLn+1 adjacent to the selected word line WLn, in the operation of reading the selected word line WLn. Specifically, the charge voltage for the bit line is set lower for a memory cell having a larger shift amount of the threshold voltage due to inter-cell interference. In the read operation, only one type of read pass voltage Vread is applied to non-selected word lines (including the adjacent word line WLn+1).

Thus, according to the eighth embodiment, it is possible to simultaneously perform correction readings corresponding to the respective threshold voltage distributions of the adjacent memory cells. This structure shortens the read time. In addition, since read operation can be performed such that a variation in the threshold voltage due to inter-cell interference is corrected, the read operation can be performed more accurately. The correction reading of the eighth embodiment may be performed only when an ECC error occurs in normal read operation.

In the above explanation, correction reading is performed in accordance with the data of the adjacent memory cell connected to the adjacent word line. However, the embodiment is not limited to it, but the charge voltage for the bit line may be changed in accordance with the data of the memory cell connected to the adjacent bit line, when program operation and read operation are performed for bit lines of even numbers and bit lines of odd numbers separately.

Ninth Embodiment

In the eighth embodiment, four bit-line charge voltages corresponding to threshold voltage distributions E, A, B, and C are used in correction reading. In the ninth embodiment, correction reading is performed with two bit-line charge voltages.

As described above, when an upper page is programmed to a memory cell in which a lower page is programmed, the shift amount of the threshold voltage thereof increases in the order of threshold voltage distributions E, B, A, and C. Thus, in the ninth embodiment, the selected memory cell is read by using the same bit-line charge voltage VBL1 in threshold voltage distributions A and C, which have a comparatively large shift amount of the threshold voltage of the adjacent memory cell. The selected memory cell is read by using the same bit-line charge voltage VBL2 (VBL1<VBL2) in threshold voltage distributions E and B, which have a comparatively small shift amount of the threshold voltage of the adjacent memory cell. Operations of the ninth embodiment will be explained hereinafter, in the order of lower-page read, upper-page read, and sequential read.

[1. Lower-Page Read]

FIG. 30 is a timing chart illustrating lower-page reading according to the ninth embodiment. First, previous read operation is performed previous to read operation, in the same manner as the eighth embodiment. Next, a read operation (correction read operation) is performed. FIG. 30 illustrates bit-line waveforms corresponding to the cases where the threshold voltages of the adjacent memory cell connected to word line WLn+1 are E, A, B, and C.

In the read operation, a read voltage BR to read a lower page is applied to the selected word line WLn, and a read pass voltage Vread is applied to the other word lines (including word line WLn+1). The bit lines which correspond to the selected memory cells, adjacent memory cells of which have threshold voltages of A and C, are charged to VBL1. The bit lines which correspond to the selected memory cells, adjacent memory cells of which have threshold voltages of E and B, are charged to VBL2. For example, VBL2 is equal to VBLC. The waveform of VBL2 is superposed on the waveform of the VBL1 in FIG. 30, to compare the voltage level.

Thereby, correction is performed to further lower the bit line voltage of a memory cell having a larger shift amount of the threshold voltage due to inter-cell interference in sensing. Thus, correction reading is achieved. In addition, it is possible to simultaneously perform correction readings corresponding to threshold voltage distributions E, A, B, and C.

[2. Upper-Page Read]

FIG. 31 is a timing chart illustrating an upper-page read operation according to the ninth embodiment. The upper-page data is determined by sensing results using read voltages AR and CR.

First, previous read operation is performed previous to the read operation, in the same manner as the eight embodiment. Then, the read operation (correction read operation) is performed. In the read operation, read voltages AR and CR to read the upper page are successively applied to the selected word line WLn, and a read pass voltage Vread is applied to the other word lines (including word line WLn+1). The charge voltage for the bit line BL is the same as that in the lower-page read. The bit line is charged to the same voltage, during read periods using the read voltages AR and CR.

Thereby, it is possible to simultaneously perform correction readings corresponding to threshold voltage distributions E, A, B, and C, in each of the read operations using the respective read voltages AR and CR.

[3. Sequential Read]

FIG. 32 is a timing chart illustrating a sequential read operation according to the ninth embodiment. The lower-page data and the upper-page data are determined by sensing results using the read voltages AR, BR, and CR.

First, previous read operation is performed previous to the read operation, in the same manner as the eight embodiment. Then, the read operation (correction read operation) is performed. In the read operation, read voltages AR, BR, and CR are successively applied to the selected word line WLn, and the read pass voltage Vread is applied to the other word lines (including word line WLn+1). The charge voltage for the bit line BL is the same as that in the lower-page read. The bit line is charged to the same voltage, during read periods using the read voltages AR, BR, and CR.

Thereby, it is possible to simultaneously perform correction readings corresponding to threshold voltage distributions E, A, B, and C, in each of the read operations using the respective read voltages AR, BR, and CR.

[4. Effects]

As detailed above, according to the ninth embodiment, correction reading can be performed by using the two bit-line charge voltages VBL1 and VBL2. The ninth embodiment enables easier control of the bit lines in comparison with the eighth embodiment. The other effects of the ninth embodiment are the same as those of the eighth embodiment.

Although the second to ninth embodiments are explained with an example of using an MLC, they may be applied to an SLC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a memory cell array comprising memory strings, each of the memory strings comprising memory cells connected in series;
    bit lines connected to the memory strings, respectively;
    word lines connected to the memory cells, respectively, and connected to the memory strings in common; and
    a control circuit configured to repeat a program operation of applying a program pulse voltage to a selected word line and programming data in selected memory cells connected to the selected word line, and a verify operation of checking threshold voltages of the selected memory cells,
    wherein the control circuit performs a first verify operation of sensing whether the threshold voltages of the selected memory cells are greater than or equal to a first threshold voltage, and a second verify operation of sensing whether the threshold voltages of the selected memory cells are greater than or equal to a second threshold voltage, wherein the first threshold voltage is less than the second threshold voltage,
    wherein the control circuit performs a charging operation and then performs a sensing operation,
    wherein the control circuit charges a first bit line for the first verify operation to a first charge voltage and charges a second bit line for the second verify operation to a second charge voltage in the charging operation, the second charge voltage being different from the first charge voltage,
    wherein the control circuit senses discharge states of the charged first and second bit lines in the sensing operation,
    wherein the first charge voltage and the second charge voltage are not 0V, and
    wherein the control circuit simultaneously performs the first verify operation and the second verify operation.

2. The device of claim 1, wherein the second charge voltage is lower than the first charge voltage.

3. The device of claim 1, wherein a sensing time of the second verify operation is longer than a sensing time of the first verify operation.

4. The device of claim 1, wherein the control circuit uses a same verify voltage applied to the selected word line in the first verify operation and the second verify operation.

5. The device of claim 1, wherein:
    the control circuit performs the first verify operation again for a memory cell, for which the first verify operation has passed and the second verify operation has failed, when a predetermined number of program loops have been performed, and
    the control circuit finishes the program operation of the memory cell when the first verify operation has passed.

6. The device of claim 1, wherein the control circuit finishes the program operation for a memory cell, for which the first verify operation has passed and the second verify operation has failed, when a predetermined number of program loops has been performed.

7. The device of claim 1, wherein:
    the control circuit performs the program operation by applying a first voltage to a bit line connected to a memory cell, for which the first verify operation has failed, and
    the control circuit performs the program operation by applying a second voltage to a bit line connected to a memory cell, for which the first verify operation has passed and the second verify operation has failed, wherein the first voltage is less than the second voltage.

8. The device of claim 7, wherein the control circuit performs the program operation by applying the first voltage to the bit line connected to the memory cell, for which the first verify operation has passed and the second verify operation has failed, when a predetermined number of program loops has been performed.

9. The device of claim 1, wherein the control circuit starts the verify operation after program operations are successively performed.

10. The device of claim 9, wherein:
    the control circuit performs the first verify operation and the second verify operation with a same bit-line charge voltage in the verify operation started directly after the program operations are successively performed, and
    a sensing time of the second verify operation is longer than a sensing time of the first verify operation in the started verify operation.

11. The device of claim 1, wherein the control circuit does not charge bit lines connected to memory cells not to be verified among the bit lines.

12. The device of claim 1, wherein each of the memory cells includes a charge storage layer.

13. A nonvolatile semiconductor memory device comprising:
    a memory cell array comprising memory strings, each of the memory strings comprising memory cells connected in series;
    bit lines connected to the memory strings, respectively;
    word lines connected to the memory cells, respectively, and connected to the memory strings in common; and
    a control circuit configured to perform a previous read operation of reading data of adjacent memory cells connected to an adjacent word line adjacent to a selected word line, and a read operation of reading data of selected memory cells connected to the selected word line in accordance with a previous read result obtained by the previous read operation,
    wherein the read operation includes a charging operation and a sensing operation after the charging operation,
    wherein the control circuit charges first and second bit lines respectively to first and second charge voltages in accordance with the previous read result, in the charging operation, the second charge voltage being different from the first charge voltage, wherein the control circuit senses discharge states of the charged first and second bit lines in the sensing operation, wherein the first charge voltage and the second charge voltage are not 0V, and wherein the control circuit simultaneously performs the read operation of the selected memory cells.

14. The device of claim 13, wherein a charge voltage for the bit lines is set to a lower value for a bit line connected to a selected memory cell having a larger shift amount of a threshold voltage due to inter-cell interference with an adjacent memory cell.

15. The device of claim 13, wherein the control circuit applies a fixed read pass voltage to the adjacent word line in the read operation, the read pass voltage being configured to turn on the adjacent memory cells regardless of storage data.

16. The device of claim 15, wherein the control circuit applies the same read pass voltage to word lines other than the selected word line and the adjacent word line among the word lines, in the read operation.

17. The device of claim 13, wherein the control circuit applies a read voltage to the selected word line in the read operation, the read voltage being configured to determine threshold voltages of the selected memory cells.

18. The device of claim 13, wherein each of the memory cells includes a charge storage layer.

19. A nonvolatile semiconductor memory device comprising:

a memory cell array comprising memory strings, each of the memory strings comprising memory cells connected in series;

bit lines connected to the memory strings, respectively;

word lines connected to the memory cells, respectively, and connected to the memory strings in common; and a control circuit configured to repeat a program operation of applying a program pulse voltage to a selected word line and programming data in selected memory cells connected to the selected word line, and a verify operation of checking threshold voltages of the selected memory cells, wherein the control circuit performs a first verify operation of sensing whether the threshold voltages of the selected memory cells are greater than or equal to a first threshold voltage, and a second verify operation of sensing whether the threshold voltages of the selected memory cells are greater than or equal to a second threshold voltage, wherein the first threshold voltage is less than the second threshold voltage, wherein the control circuit performs a charging operation and then performs a sensing operation, wherein the control circuit charges a first bit line for the first verify operation to a first charge voltage and charges a second bit line for the second verify operation to a second charge voltage in the charging operation, the second charge voltage being different from the first charge voltage, wherein the control circuit senses discharge states of the charged first and second bit lines in the sensing operation, wherein the first charge voltage and the second charge voltage are not 0V, and wherein the second charge voltage is lower than the first charge voltage.

* * * * *